(12) United States Patent
Seo et al.

(10) Patent No.: US 10,321,583 B2
(45) Date of Patent: Jun. 11, 2019

(54) DISPLAY DEVICE

(71) Applicant: SAMSUNG DISPLAY CO., LTD., Yongin-si, Gyeonggi-Do (KR)

(72) Inventors: Tae An Seo, Hwaseong-si (KR); Jung Hun Lee, Hwaseong-si (KR); Jin Hwan Choi, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 24 days.

(21) Appl. No.: 15/705,798

(22) Filed: Sep. 15, 2017

(65) Prior Publication Data

US 2018/0103550 A1    Apr. 12, 2018

(30) Foreign Application Priority Data

Oct. 10, 2016 (KR) .................. 10-2016-0130795

(51) Int. Cl.
*H05K 5/00* (2006.01)
*H01F 7/02* (2006.01)
*H04N 5/64* (2006.01)

(52) U.S. Cl.
CPC .......... *H05K 5/0017* (2013.01); *H01F 7/0205* (2013.01); *H04N 5/64* (2013.01); *H05K 5/0086* (2013.01)

(58) Field of Classification Search
CPC ... H05K 5/0017; H05K 5/0086; H01F 7/0205
USPC ..................................................... 361/679.56
See application file for complete search history.

(56) References Cited

U.S. PATENT DOCUMENTS

| | | | | |
|---|---|---|---|---|
| 7,180,665 | B2 * | 2/2007 | Daniel | G06F 1/1601 160/373 |
| 7,440,265 | B2 * | 10/2008 | Ou Yang | G06F 1/1601 348/375 |
| 7,864,418 | B2 * | 1/2011 | Kuroi | F16M 11/38 160/377 |
| 7,907,337 | B2 * | 3/2011 | Daniel | G06F 1/1601 160/373 |
| 8,379,377 | B2 * | 2/2013 | Walters | G06F 1/1641 248/917 |
| 9,120,290 | B2 * | 9/2015 | Krall | B32B 3/28 |
| 2011/0043976 | A1 * | 2/2011 | Visser | G09F 9/00 361/679.01 |
| 2014/0247544 | A1 * | 9/2014 | Ryu | G09F 11/18 361/679.01 |
| 2015/0047796 | A1 * | 2/2015 | Peng | E06B 9/42 160/323.1 |

* cited by examiner

*Primary Examiner* — Rockshana D Chowdhury
(74) *Attorney, Agent, or Firm* — F. Chau & Associates, LLC

(57) ABSTRACT

The display device includes a housing, a first roller portion, a second roller portion, a rail portion, and a flexible display panel. The housing includes a support plate. The first roller portion is disposed at a first side of the support plate and is connected to the housing by a first sliding portion. The second roller portion is disposed at a second side of the support plate and is connected to the housing by a second sliding portion. The rail portion includes fixing rails affixed to the support plate, first moving rails connected to the first roller portion and engaged with the fixing rails, and second moving rails connected to the second roller portion and engaged with the fixing rails. The flexible display panel covers the rail portion. The flexible display panel has ends respectively connected to the first roller portion and the second roller portion.

21 Claims, 27 Drawing Sheets

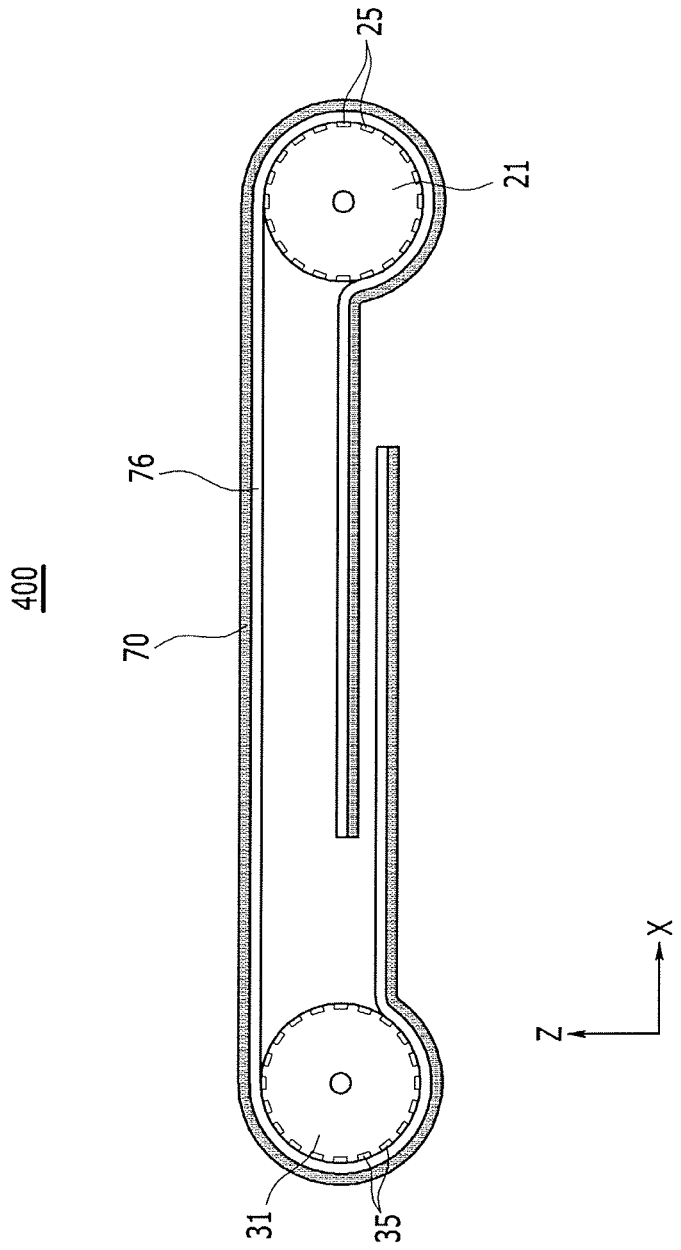

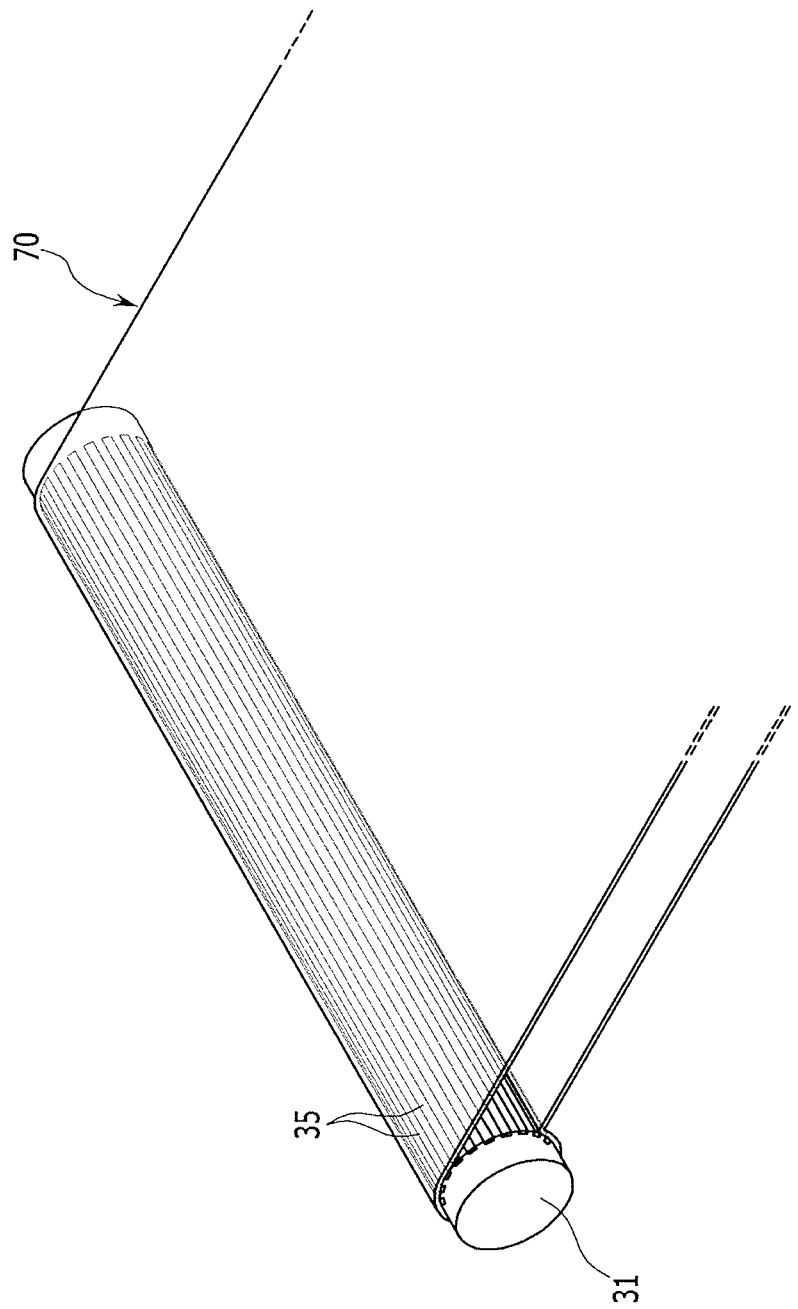

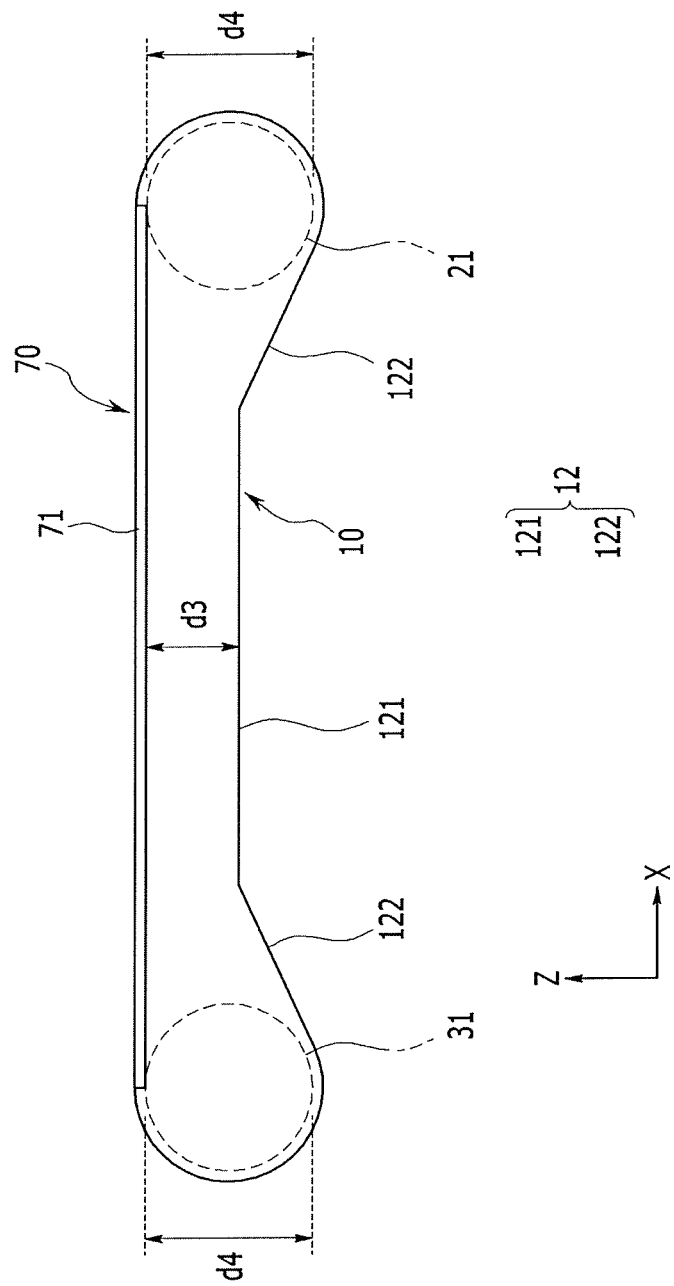

DISPLAY DEVICE

CROSS-REFERENCE TO RELATED APPLICATION

This application claims priority under 35 U.S.C. § 119 to Korean Patent Application No. 10-2016-0130795 filed in the Korean Intellectual Property Office on Oct. 10, 2016, the disclosure of which is incorporated by reference herein in its entirety.

TECHNICAL FIELD

Exemplary embodiments of the present invention relate to a display device, and more particularly to an expandable display device.

DISCUSSION OF RELATED ART

Mobile electronic devices may perform various functions such as motion picture reproduction, digital multimedia broadcasting reception, video calling, Internet access, and application driving. Mobile electronic devices may include relatively large display devices. The display devices may display various multimedia information and application information. However, as the size of display device increases, an external shape of the mobile electronic device may increase. Thus, a portability of the display device may decrease.

A flexible display panel may have a characteristic of being relatively easily bent. The flexible display panel may include a flexible substrate such as a plastic film. The flexible display panel may also include a plurality of pixels. The plurality of pixels may be disposed on the flexible substrate. A rollable display device, a foldable display device, and an expandable display device, including the flexible display panel have been under recent development.

The expandable display device may include a sliding mechanism and a display unit. The sliding mechanism may be combined with the flexible display panel. When the expandable display device is used, the display unit may be expanded through the sliding mechanism. Accordingly, a size of the display unit thereof may be reduced when it is moved or stored. A mobile electronic device including the expandable display device may be portable.

SUMMARY

Exemplary embodiments of the present invention provide a display device that may increase a size of a display area in an expanded mode through a dual-expandable mechanism. Thus, the display device may be expandable to opposite sides.

Exemplary embodiments of the present invention provide a display device that may reduce stress applied to a flexible display panel thereof and may be stably expanded or reduced.

A display device according to an exemplary embodiment of the present invention includes a housing, a first roller portion, a second roller portion, a rail portion, and a flexible display panel. The housing includes a support plate. The first roller portion is disposed at a first side of the support plate. The first roller portion is connected to the housing by a first sliding portion. The second roller portion is disposed at a second side of the support plate. The second roller portion is connected to the housing by a second sliding portion. The rail portion includes a plurality of fixing rails, a plurality of first moving rails, and a plurality of second moving rails. The flexible display panel covers the rail portion. Ends of the flexible display panel are respectively connected to the first roller portion and the second roller portion. The plurality of fixing rails are affixed to the support plate. The plurality of first moving rails are connected to the first roller portion. The plurality of first moving rails are engaged with the plurality of fixing rails. The plurality of second moving rails are connected to the second roller portion. The plurality of second moving rails are engaged with the plurality of fixing rails.

The first roller portion may include a first roller and a second roller housing. The first roller housing may partially enclose the first roller. The first roller housing may include a first slit substantially parallel to an axis direction of the first roller. The second roller portion may include a second roller and a second roller housing. The second roller housing may partially enclose the second roller. The second roller housing may include a second slit substantially parallel to the axis direction of the second roller.

The first sliding portion may include a first driving slider, a first following slider, and a first actuator. The first driving slider may be affixed to a first end of the first roller housing. The first following slider may be affixed to a second end of the first roller housing. The first actuator may be connected to the first driving slider. The second sliding portion may include a second following slider, a second driving slider, and a second actuator. The second following slider may be affixed to a first end of the second roller housing. The second driving slider may be affixed to a second end of the second roller housing. The second actuator may be connected to the second driving slider.

The first driving slider and the second following slider may be separated from each other along the axis direction of the first roller. A first guiding wall may be disposed between the first driving slider and the second following slider. The second driving slider and the first following slider may be separated from each other along the axis direction of the first roller. A second guiding wall may be disposed between the second driving slider and the first following slider.

The first driving slider and the second following slider may face each other along a thickness direction of the display device. The first driving slider and the second following slider may each be configured to move along a first guiding wall. The second driving slider and the first following slider may face each other along the thickness direction. The second driving slider and the first following slider may each be configured to move along a second guiding wall.

The plurality of first moving rails may be affixed to the first roller housing. The plurality of second moving rails may be affixed to the second roller housing. The plurality of first moving rails and the plurality of second moving rails may each overlap the support plate in an unexpanded mode. The plurality of first moving rails and the plurality of second moving rails may each outwardly extend from the support plate in an expanded mode.

At least one first moving rail and at least one second moving rail may have side surfaces engaged with each other. The at least one first moving rail and the at least one second moving rail may be disposed between adjacent fixing rails.

At least one first moving rail and at least one second moving rail may be alternately disposed between the plurality of fixing rails.

Side surfaces of each of the plurality of fixing rails, the plurality of first moving rails, and the plurality of second moving rails may be engaged with each other by a first protrusion-groove structure.

At least one selected from the plurality of fixing rails, the plurality of first moving rails, and the plurality of second moving rails may be engaged with the support plate to each other by a second protrusion-groove structure.

A length of each of the plurality of first moving rails may be larger than a maximum sliding distance of the first roller housing. A length of each of the plurality of second moving rails may be larger than a maximum sliding distance of the second roller housing.

The rail portion may further include a first tensioner and a second tensioner. The first tensioner may be affixed to at least one fixing rail and at least one first moving rail. The second tensioner may be affixed to at least one fixing rail and at least one second moving rail. Each of the plurality of fixing rails, the plurality of first moving rails, and the plurality of second moving rails may be an annular rail.

The first tensioner may include a first fixing pin, a first moving pin, and a first elastic part. The first fixing pin may be affixed to the fixing rail. The first moving pin may be affixed to the first moving rail. The first moving pin may extend inside the fixing rail. The first elastic part may be disposed between the first fixing pin and the first moving pin. The second tensioner may include a second fixing pin, a second moving pin, and a second elastic part. The second fixing pin may be affixed to the fixing rail. The second moving pin may be affixed to the second moving rail. The second moving pin may extend inside the fixing rail. The second elastic part may be disposed between the second fixing pin and the second moving pin.

The flexible display panel may include a first display portion, a second display portion, and a third display portion. The first display portion may overlap the support plate. The first display portion may be affixed to the plurality of fixing rails. The second display portion may be positioned at a first side of the first display portion. The third display portion may be positioned at a second side of the first display portion.

In an unexpanded mode, the second display portion may be disposed in the first roller housing through the first slit such that a part thereof is in contact with the first roller and a remaining part thereof overlaps the first display portion. The third display portion may be disposed in the second roller housing through the second slit such that a part thereof is in contact with the second roller and a remaining part thereof overlaps the first display portion.

In an expansion mode, the second display portion may be removed from the first roller housing to be substantially parallel to the first display portion and may be supported by the plurality of first moving rails. The third display portion may be removed from the second roller housing to be substantially parallel to the first display portion and may be supported by the plurality of second moving rails.

The flexible display panel may further include a first dummy portion and a second dummy portion. The first dummy portion may be disposed outside the second display portion. The second dummy portion may be disposed outside the third display portion. In the expanded mode, the first dummy portion may be in contact with the first roller and the second dummy portion may be in contact with the second roller.

The first guiding part may be connected to the first roller housing at a rear of the support plate. The first guiding part may be configured to receive the second display portion and the first dummy portion. The second guiding part may be connected to the second roller housing at the rear of the support plate. The second guiding part may be configured to receive the third display portion and the second dummy portion.

In the unexpanded mode, the first display portion may include a first flat portion, a first curved portion, and a second curved portion. The first curved portion may be in contact with the first roller. The second curved portion may be contact with the second roller.

In the expanded mode, the second display portion may include a second flat portion and a third curved portion. The second flat portion may be supported by the plurality of first moving rails. The third curved portion may be in contact with the first roller. The third display portion may include a third flat portion and a fourth curved portion. The third flat portion may be supported by the plurality of second moving rails. The fourth curved portion may be in contact with the second roller.

The flexible display panel may include a metal sheet. The metal sheet may be disposed in a direction toward the rail portion. The first roller may include a plurality of first magnets. The second roller may include a plurality of second magnets.

The plurality of first magnets may form a belt shape substantially parallel to an axis direction of the first roller. The plurality of first magnets may be disposed at intervals along a circumferential direction of the first roller. The plurality of second magnets may form a belt shape substantially parallel to an axis direction of the second roller. The plurality of second magnets may be disposed at intervals along the circumferential direction of the second roller.

BRIEF DESCRIPTION OF THE DRAWINGS

The above and other features of the present invention will become more apparent by describing in detail exemplary embodiments thereof, with reference to the accompanying drawings, in which:

FIG. 14 is a partial cross-sectional view illustrating an expandable display device according to an exemplary embodiment of the present invention;

FIG. 15 is a schematic diagram illustrating a second roller and a flexible display panel illustrated in FIG. 14 according to an exemplary embodiment of the present invention;

FIG. 21 is a side view illustrating an expandable display device according to an exemplary embodiment of the present invention.

DETAILED DESCRIPTION OF THE EMBODIMENTS

Figure 1:
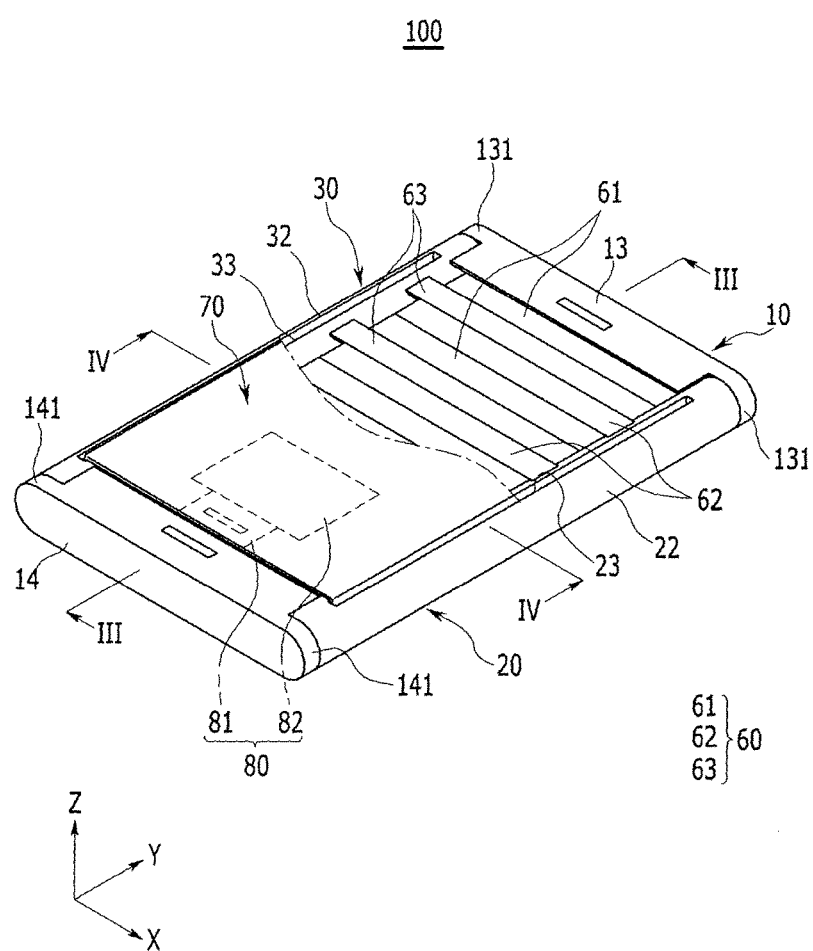
FIG. 1 is a perspective view illustrating an unexpanded mode of an expandable display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Figure 2:
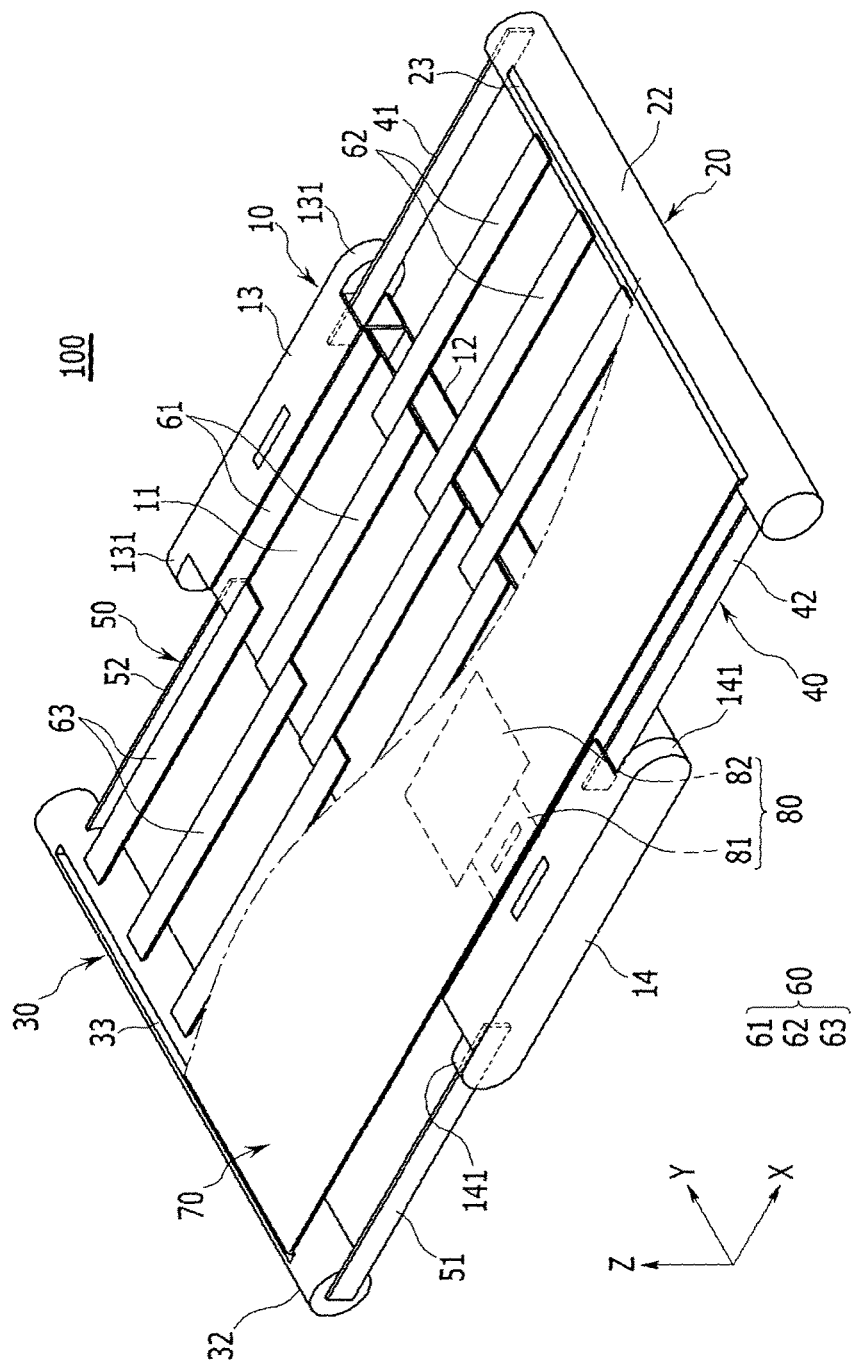
FIG. 2 is a perspective view illustrating an expanded mode of an expandable display device according to an exemplary embodiment of the present invention.
Figure 3:
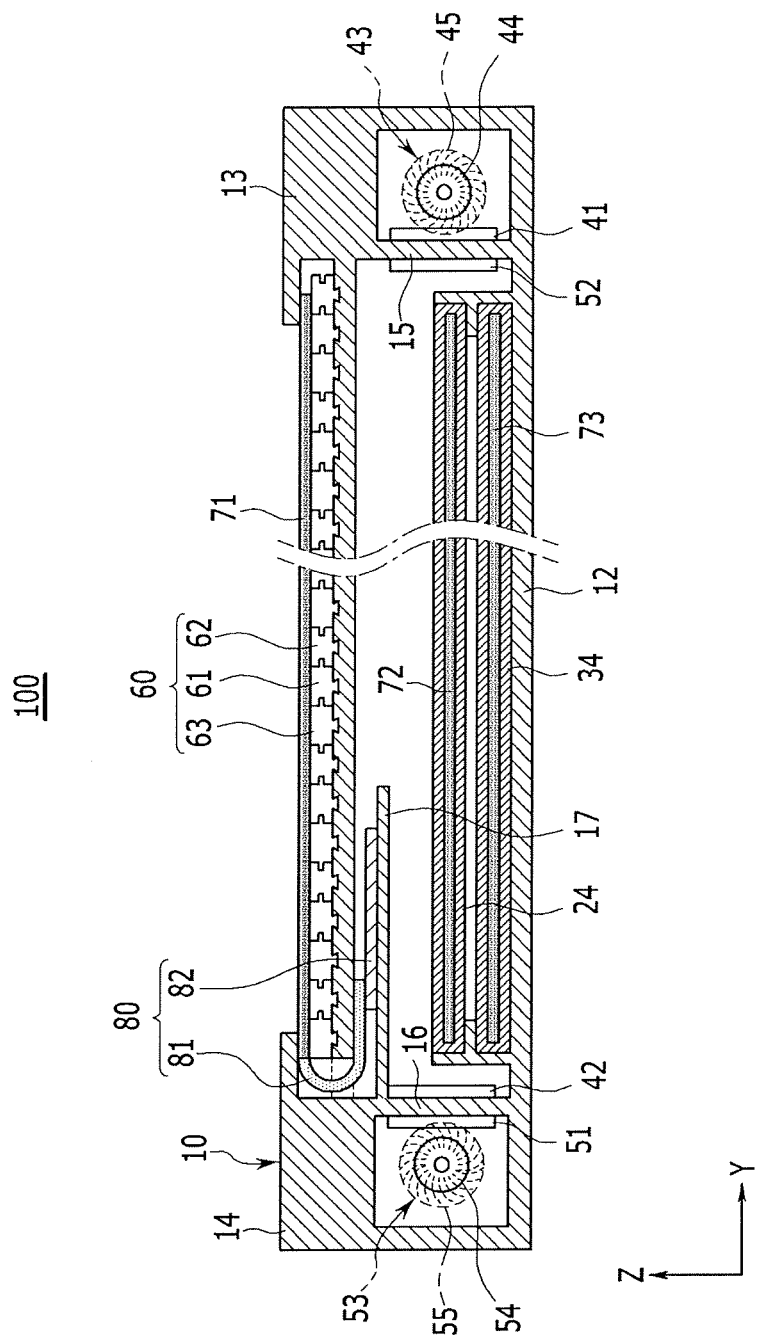
FIG. 3 is a cross-sectional view taken along a line of FIG. 1 according to an exemplary embodiment of the present invention.
Figure 4:
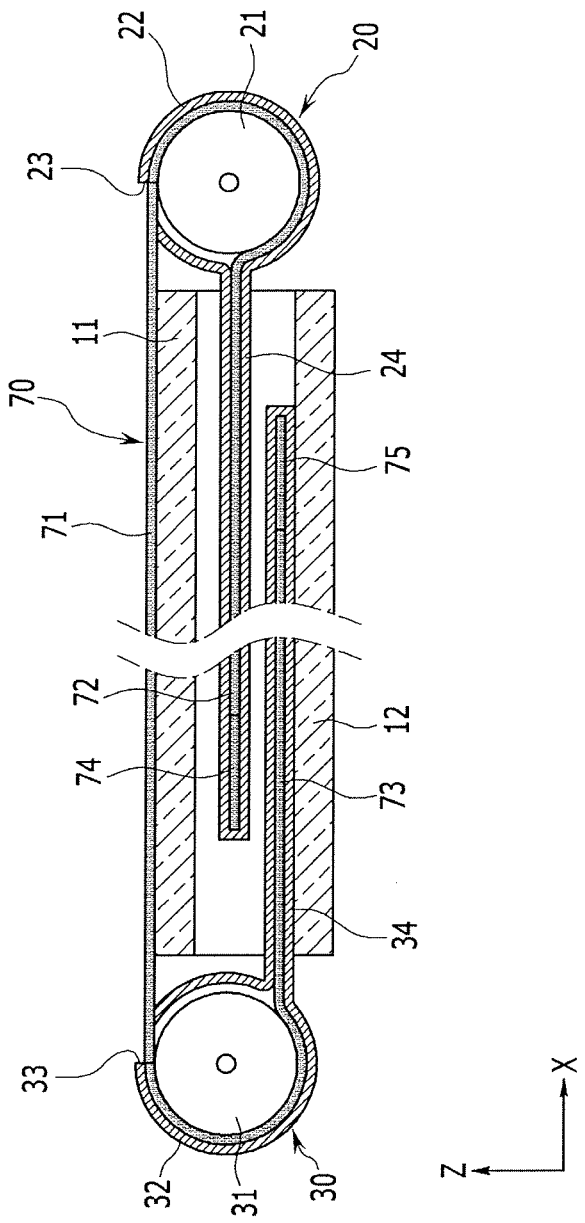
FIG. 4 is a cross-sectional view taken along a line IV-IV of FIG. 1 according to an exemplary embodiment of the present invention.

FIG. 1 is a perspective view illustrating an unexpanded mode of an expandable display device according to an exemplary embodiment of the present invention. FIG. 2 is a perspective view illustrating an expanded mode of an expandable display device according to an exemplary embodiment of the present invention. FIG. 3 is a cross-sectional view taken along a line III-III of FIG. 1 according to an exemplary embodiment of the present invention. FIG. 4 is a cross-sectional view taken along a line IV-IV of FIG. 1 according to an exemplary embodiment of the present invention.

Referring to FIGS. 1 to 4, an expandable display device 100 may include a housing 10, a first roller portion 20, a second roller portion 30, a first sliding portion 40, a second sliding portion 50, a rail portion 60, and a flexible display panel 70.

The housing 10 may include a support plate 11, an auxiliary support plate 12, a first receiving portion 13, and a second receiving portion 14. The support plate 11 and the auxiliary support plate 12 may face each other along a Z-axis direction. The first receiving portion 13 may be connected to a first side of the support plate 11. The first receiving portion 13 may also be connected to a first side of the auxiliary support plate 12. The second receiving portion 14 may be connected to a second side of the support plate 11. The second receiving portion 14 may also be connected to a second side of the auxiliary support plate 12. The support plate 11 may be an upper support plate. For example, the support plate 11 may be positioned at an upper portion of the expandable display device 100. The auxiliary support plate 12 may be a lower support plate. For example, the auxiliary support plate 12 may be positioned at a lower portion of the expandable display device 100.

The first receiving portion 13 and the second receiving portion 14 may face each other along a Y-axis direction. The first receiving portion 13 and the second receiving portion 14 may each include an inner space. The inner space of the first receiving portion 13 may include a first motor 44. The inner space of the second receiving portion 14 may include a second motor 54. The first receiving portion 13 may include a plurality of protrusions 131. The protrusions 131 may be positioned along an X-axis direction at ends of the first receiving portion 13. The protrusions 131 may have a semi-cylinder shape. The second receiving portion 14 may include a plurality of protrusions 141. The protrusions 141 may be positioned along an X-axis direction at ends of the second receiving portion 14. The protrusions 141 may have a semi-cylinder shape.

The X-axis direction may be a first surface direction of the expandable display device 100. The Y-axis direction may be a second surface direction of the expandable display device 100. The second surface direction may cross the first surface direction. A Z-axis direction may be a thickness direction of the expandable display device 100. The X-axis direction may be a horizontal direction. The Y-axis direction may be a vertical direction.

The first roller portion 20 may be positioned at a first side of the support plate 11. The first roller portion 20 may also be positioned at a first side of the auxiliary support plate 12. The second roller portion 30 may be positioned at a second side of the support plate 11. The second roller portion 30 may also be positioned at a second side of the auxiliary support plate 12. The first roller portion 20 and the second roller portion 30 may face each other along the X-axis direction. The first roller portion 20 may include a first roller 21 and a first roller housing 22. The first roller housing 22 may partially enclose the first roller 21. The second roller portion 30 may include a second roller 31 and a second roller housing 32. The second roller housing 32 may partially enclose the second roller 31.

An axis direction of the first roller 21 and the second roller 31 may be substantially parallel to the Y-axis direction. The first roller housing 22 and the second roller housing 32 may have a cylinder shape. Both ends of the cylinder shape may be closed. The first roller 21 may be mounted, for example, to be rotated by a bearing. The bearing may be disposed inside the first roller housing 22. The second roller 31 may be mounted, for example, to be rotated by a bearing. The bearing may be disposed inside the second roller housing 32.

The first roller housing 22 may include a first slit 23. The first slit 23 may be substantially parallel to an axial direction of the first roller 21, e.g., the Y-axis direction. The second roller housing 32 may include a second slit 33. The second slit 33 may be substantially parallel to an axial direction of the second roller 31, e.g. the Y-axis direction. A portion of the flexible display panel 70 may enter the first roller housing 22 through the first slit 23. The portion of the flexible display panel 70 entering the first roller housing 22 through the first slit 23 may contact the first roller 21. A portion of the flexible display panel 70 may enter the second roller housing 32 through the second slit 33. The portion of the flexible display panel 70 entering the second roller housing 32 through the second slit 33 may contact the second roller 31.

An adhesion layer may be disposed on each of the first roller 21 and the second roller 31. The adhesion layer may have a relatively weak adhesion function. The adhesion layer may be in relatively close contact with the flexible display panel 70. In an unexpanded mode of the expandable display device 100 as illustrated in FIG. 1, respective ends of the first roller housing 22 and respective ends of the second roller housing 32 may face the protrusions 131 and 141 along the Y-axis direction. Referring to FIG. 4, the first roller 21 and the second roller 31 may have substantially the same diameter. A distance between the support plate 11 and the auxiliary support plate 12 may substantially correspond to the diameter of the first roller 21 and the second roller 31.

The first roller portion 20 may be combined with the housing 10, for example, through the first sliding portion 40. The first roller portion 20 may move by operation of the first sliding portion 40 such that a distance between the support plate 11 and the auxiliary support plate 12 is changed. The first sliding portion 40 may include a pair of first sliders 41 and 42 and a first actuator 43. The pair of first sliders 41 and 42 may be respectively affixed to opposite ends of the first roller housing 22. The first actuator 43 may be combined with a first slider 41, for example, to move the first slider 41.

The second roller portion 30 may be combined with the housing 10, for example, through the second sliding portion 50. The second roller portion 30 may move by operation of the second sliding portion 50 such that a distance between the support plate 11 and the auxiliary support plate 12 is changed. The second sliding portion 50 may include a pair of second sliders 51 and 52 and a second actuator 53. The pair of second sliders 51 and 52 may be affixed to opposite ends of the second roller housing 32. The second actuator 53 may be combined with a second slider 51, for example, to move the second slider 51.

Figure 5:
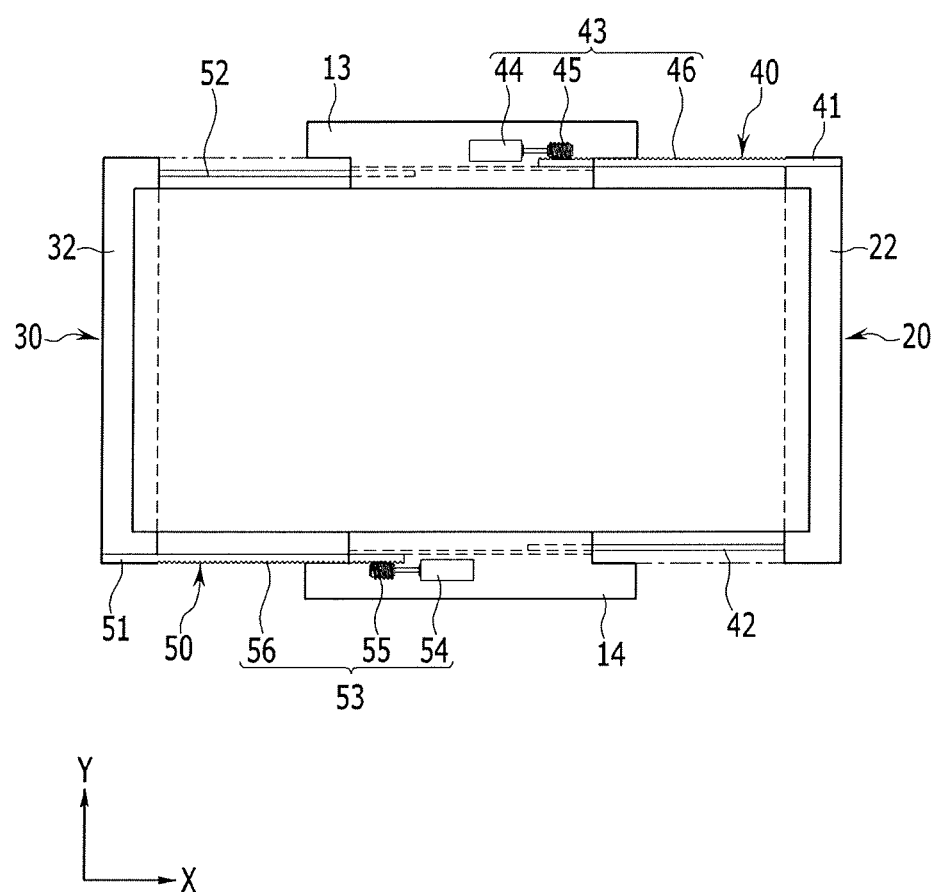
FIG. 5 is a top plan view illustrating an expandable display device of FIG. 2 according to an exemplary embodiment of the present invention.

FIG. 5 is a top plan view illustrating an expandable display device of FIG. 2 according to an exemplary embodiment of the present invention.

Referring to FIGS. 1 to 5, the pair of first sliders 41 and 42 may be positioned to be substantially parallel to the X-axis direction. The pair of first sliders 41 and 42 may face each other along the Y-axis direction. The pair of first sliders 41 and 42 may have a bar shape. The pair of second sliders 51 and 52 may be positioned to be substantially parallel to the X-axis direction. The pair of second sliders 51 and 52 may face each other along the Y-axis direction. A thickness direction of each of the pair of first sliders 41 and 42 and the pair of second sliders 51 and 52 may correspond to the Y-axis direction.

The pair of first sliders 41 and 42 may include a first driving slider 41 and a first following slider 42. The first driving slider 41 may be positioned at the first receiving portion 13 of the housing 10. The first following slider 42 may be positioned at the second receiving portion 14 of the housing 10. The pair of second sliders 51 and 52 may include a second driving slider 51 and a second following slider 52. The second driving slider 51 may be positioned at the second receiving portion 14 of the housing 10. The second following slider 52 may be positioned at the first receiving portion 13 of the housing 10.

The first driving slider 41 may be positioned outside the second following slider 52. Thus, the first driving slider 41 might not collide with the second following slider 52. The second driving slider 51 may be positioned outside the first following slider 42. Thus, the second driving slider 51 might not collide with the first following slider 42. A first guiding wall 15 may be disposed between the first driving slider 41 and the second following slider 52. A second guiding wall 16 may be disposed between the second driving slider 51 and the first following slider 42.

The first guiding wall 15 and an inside of the first receiving portion 13 may guide a movement of each of the first driving slider 41 and the second following slider 52. The first guiding wall 15 may divide a space between the support plate 11 and the auxiliary support plate 12. The second guiding wall 16 and an inside of the second receiving portion 14 may guide a movement of each of the second driving slider 51 and the first following slider 42. The second guiding wall 16 may divide a space between the support plate 11 and the auxiliary support plate 12. The pair of first sliders 41 and 42 and the pair of second sliders 51 and 52 may each be positioned at substantially the same height from a lowest end of the housing 10.

The first actuator 43 may include a first motor 44, a first pinion gear 45, and a first rack gear 46. The first motor 44 may be affixed to the first receiving portion 13. The first pinion gear 45 may be combined with the first motor 44. The first rack gear 46 may be positioned at a surface of the first driving slider 41, for example, to be engaged with the first pinion gear 45. The second actuator 53 may include a second motor 54, a second pinion gear 55, and a second rack gear 56. The second motor 54 may be affixed to the second receiving portion 14. The second pinion gear 55 may be combined with the second motor 54. The second rack gear 56 may be positioned at a surface of the second driving slider 51, for example, to be engaged with the second pinion gear 55.

If the first pinion gear 45 is rotated by the driving of the first motor 44, the first driving slider 41 may move the first roller portion 20 while being moved itself in the X-axis direction. A position of the first roller portion 20 may be determined, for example, depending on a rotation direction and a rotation amount of the first motor 44. If the second pinion gear 55 is rotated by the driving of the second motor 54, the second driving slider 51 may move the second roller portion 30 while being moved itself in the X-axis direction. A position of the second roller portion 30 may be determined, for example, depending on a rotation direction and a rotation amount of the second motor 54.

Although the motor as a power source and the first sliding portion 40 and the second sliding portion 50 including the rack gear and the pinion gear as a power delivery mechanism have been described herein, the first sliding portion 40 and the second sliding portion 50 are not limited thereto. For example, another type of power source may be applied. Another type of power delivery mechanism may also be applied.

Referring to FIGS. 1 to 4, the rail portion 60 may be positioned on each of the support plate 11, the first roller portion 20 and second roller portion 30. The rail portion 60 may support the flexible display panel 70.

The rail portion 60 may include a plurality of fixing rails 61, a plurality of first moving rails 62, and a plurality of second moving rails 63. The plurality of fixing rails 61 may be affixed to the support plate 11. The plurality of first moving rails 62 may be combined with the first roller portion 20. The plurality of first moving rails 62 may be engaged with a first side surface of each of the plurality of fixing rails 61. The plurality of second moving rails 63 may be combined with the second roller portion 30. The plurality of second moving rails 63 may be engaged with a second side surface of each of the plurality of fixing rails 61. The plurality of fixing rails 61, the plurality of first moving rails 62, and the plurality of second moving rails 63 may each be a rail. The rail may have a belt shape. The rail may be substantially parallel to the X-axis direction. The plurality of fixing rails 61, the plurality of first moving rails 62, and the plurality of second moving rails 63 may each include a metal.

The plurality of fixing rails 61 may be aligned on the support plate 11. For example, the plurality of fixing rails 61 may be spaced apart from each other along the Y-axis direction. The plurality of first moving rails 62 may be affixed to the first roller housing 22. The plurality of first moving rails 62 may be aligned on the first roller housing 22. For example, the plurality of first moving rails 62 may be spaced apart from each other along the Y-axis direction. The plurality of second moving rails 63 may be affixed to the second roller housing 32. The plurality of second moving rails 63 may be aligned on the second roller housing 32. For example, the plurality of second moving rails 63 may be spaced apart from each other along the Y-axis direction.

The first moving rail 62 and the second moving rail 63 may each be positioned between adjacent fixing rails 61 along the Y-axis direction. A first surface of the first moving rail 62 may be engaged with a first surface of the second moving rail 63. A sequence of the fixing rail 61, the first moving rail 62, the second moving rail 63, and the fixing rail 61 may be repeatedly disposed along the Y-axis direction; however, exemplary embodiments of the present invention are not limited thereto.

Figure 6:
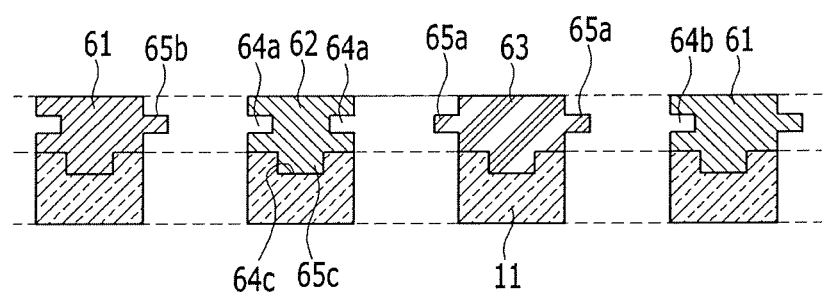
FIG. 6 is a schematic diagram illustrating a rail portion and a support plate of an expandable display device of FIG. 3 according to an exemplary embodiment of the present invention.

FIG. 6 is a schematic diagram illustrating a rail portion and a support plate of an expandable display device of FIG. 3 according to an exemplary embodiment of the present invention.

Referring to FIG. 6, side surfaces of each of the plurality of fixing rails 61, the plurality of first moving rails 62 and the plurality of second moving rails 63 may be engaged with each other, for example, through a protrusion-groove combination structure.

For example, each of the plurality of first moving rails 62 may include a first groove 64*a*. The first groove 64*a* may be formed at side surfaces of the first moving rails 62. Each of the plurality of second moving rails 63 may include a first protrusion 65*a*. The first protrusion 65*a* may be formed at side surfaces of the second moving rails 63. Each of the plurality of fixing rails 61 may include a second protrusion 65*b* and a second groove 64*b*. The second protrusion 65*b* may be formed at a first side surface of the fixing rail 61 facing the first moving rail 62. The second groove 64*b* may be formed at a second side surface of the fixing rail 61 facing the second moving rail 63.

The plurality of fixing rails 61, the plurality of first moving rails 62, and the plurality of second moving rails 63 may each include a third protrusion 65*c*. The third protrusion 65*c* may be formed at a lower surface thereof. The support plate 11 may include a plurality of third grooves 64*c*. The plurality of third grooves 64*c* may be configured to receive the plurality of third protrusions 65*c*. The plurality of first moving rails 62 and the plurality of second moving rails 63 may each slide in the X-axis direction with respect to the support plate 11.

Referring to FIGS. 1 to 4, in the unexpanded mode, the plurality of first moving rails 62 and the plurality of second moving rails 63 may be positioned on the support plate 11. The plurality of first moving rails 62 and the plurality of second moving rails 63 may be substantially parallel to the plurality of fixing rails 61. In the expanded mode, the plurality of first moving rails 62 may slide along with the first roller portion 20. Thus, the plurality of first moving rails 62 may be extended from the support plate 11 in the positive (+) X-axis direction. The plurality of second moving rails 63 may slide along with the second roller portion 30. Thus, the plurality of second moving rails 63 may be extended from the support plate 11 in the negative (−) X-axis direction.

In the extended mode, in order to not completely separate the plurality of first moving rails 62 from the plurality of fixing rails 61, lengths of the plurality of first moving rails 62 may be larger than a maximum sliding distance of the first roller housing 22. In order to not completely separate the plurality of second moving rails 63 from the plurality of fixing rails 61, lengths of the plurality of second moving rails 63 may be larger than a maximum sliding distance of the second roller housing 32.

The rail portion 60 may support the flexible display panel 70. Furthermore, in the expanded mode, the plurality of first moving rails 62 and the plurality of second moving rails 63 may each support the expanded flexible display panel 70.

The flexible display panel 70 may cover a surface of the rail portion 60. For example, the flexible display panel 70 may cover an upper surface of the rail portion 60. A center portion of the flexible display panel 70 may be affixed to the plurality of fixing rails 61. A first side outer portion of the center portion may be affixed to the first roller portion 20. A second side outer portion of the center portion may be affixed to the second roller portion 30. The first and second side outer portions respectively affixed to the first roller portion 20 and the second roller portion 30 may have a varying area.

Figure 7:
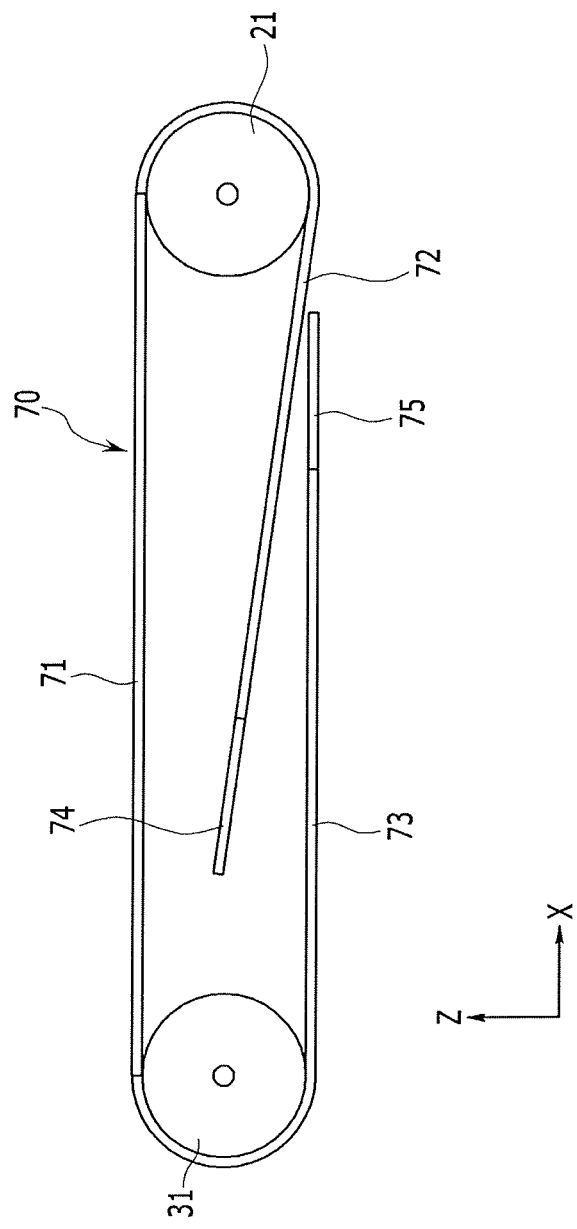
FIG. 7 is a schematic diagram illustrating a part of an expandable display device of FIG. 1 according to an exemplary embodiment of the present invention.
Figure 8:
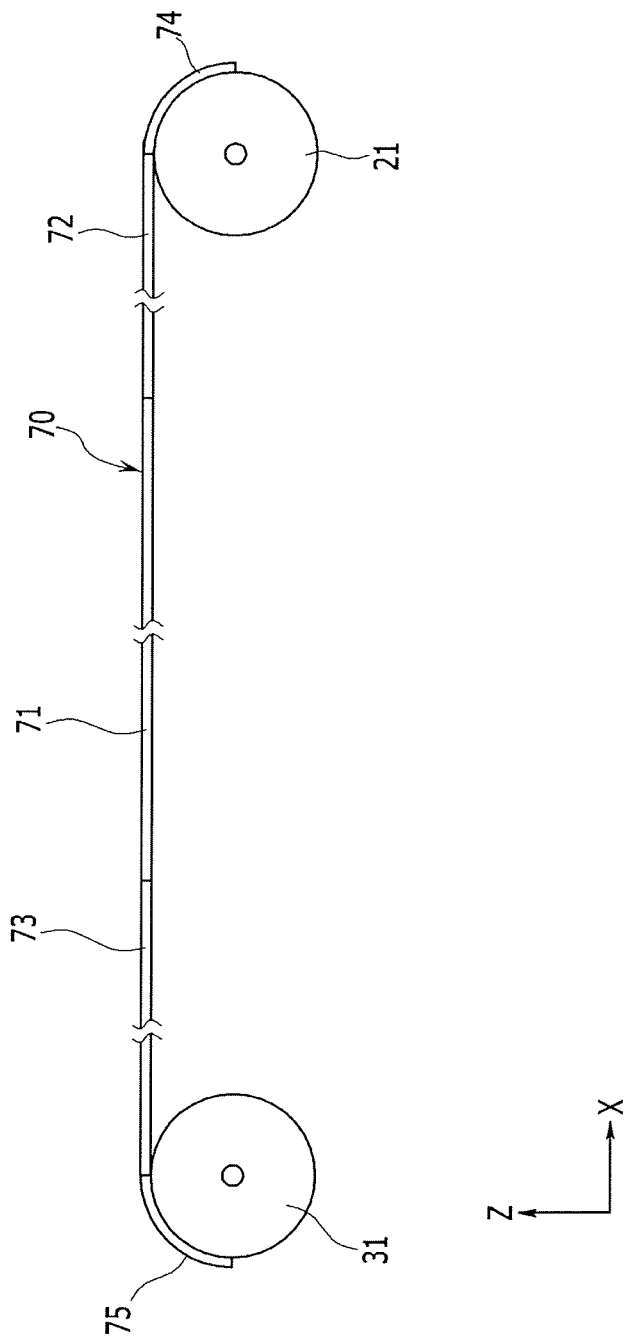
FIG. 8 is a schematic diagram illustrating a part of an expandable display device of FIG. 2 according to an exemplary embodiment of the present invention.
Figure 9:
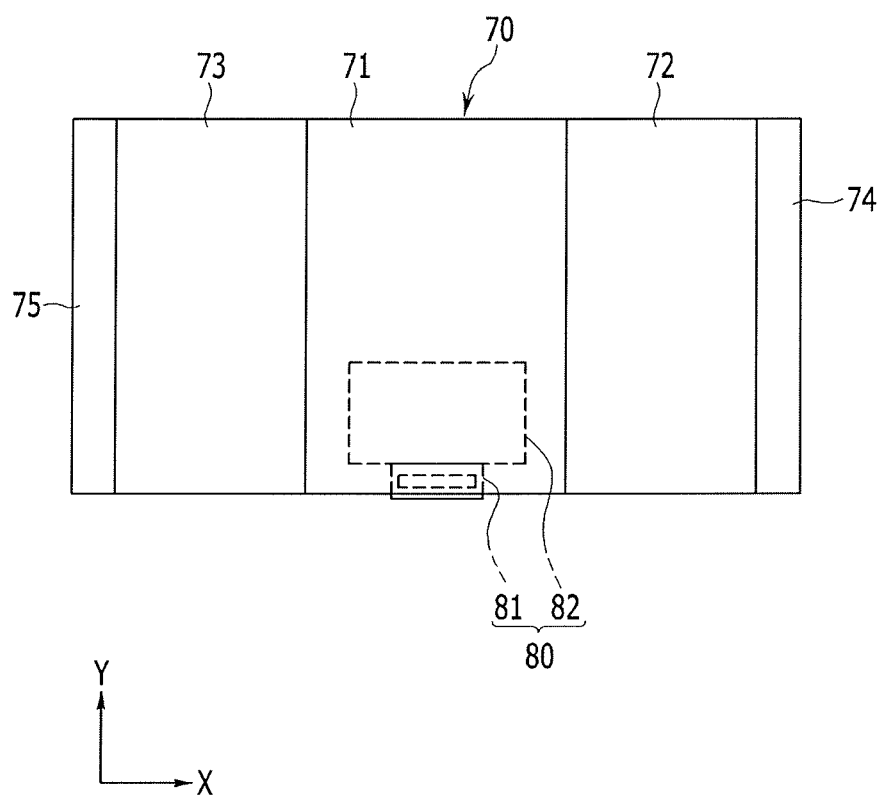
FIG. 9 is a top plan view illustrating an unfolded state of a flexible display panel of FIG. 7 according to an exemplary embodiment of the present invention.

FIG. 7 is a schematic diagram illustrating a part of an expandable display device of FIG. 1 according to an exemplary embodiment of the present invention. FIG. 8 is a schematic diagram illustrating a part of an expandable display device of FIG. 2 according to an exemplary embodiment of the present invention. FIG. 9 is a top plan view illustrating an unfolded state of a flexible display panel of FIG. 7 according to an exemplary embodiment of the present invention.

Referring to FIGS. 7 to 9, the flexible display panel 70 may include a first display portion (or a fixed display portion) 71, a second display portion (or a first variable display portion) 72, and a third display portion (or a second variable display portion) 73. The first display portion 71 may overlap the support plate 11 as illustrated in FIG. 4. The second display portion 72 may be formed at a first side of the first display portion 71. The third display portion 73 may be formed at a second side of the first display portion 71. Thus, the first display portion 71 may be disposed between the second display portion 72 and the third display portion 73. The flexible display panel 70 may include a first dummy portion 74, and a second dummy portion 75. The first dummy portion 74 may be disposed at a side of the second display portion 72. For example, the first dummy portion 74 may be disposed at a side of the second display portion 72 not in contact with the first display portion 71. The second dummy portion 75 may be disposed at a side of the third display portion 73. For example, the second dummy portion 75 may be disposed at a side of the third display portion 73 not in contact with the first display portion 71.

The second display portion 72 and the third display portion 73 may face each other along the X-axis direction, for example, via the first display portion 71. The first dummy portion 74 and the second dummy portion 75 may each be positioned outermost of the flexible display panel 70.

In the unexpanded mode, the second display portion 72 may enter inside the first roller housing 22 through the first slit 23. Thus, a part of the second display portion 72 may contact with the first roller 21. The remaining part of the second display portion 72 may overlap the first display portion 71 at a rear of the first display portion 71. In the unexpanded mode, the third display portion 73 may enter the second roller housing 32 through the second slit 33. Thus, a part of the third display portion 73 may contact the second roller 31. The remaining part of the third display portion 73 may overlap the first display portion 71 at the rear of the first display portion 71.

In the unexpanded mode, the first display portion 71 may display an image. The second display portion 72 and the third display portion 73 each might not display an image. Thus, the second display portion 72 and the third display portion 73 may be a non-display area.

In the expanded mode, the second display portion 72 may be drawn out from the first roller housing 22. The second display portion 72 may be positioned to be substantially parallel to the first display portion 71. The third display portion 73 may be drawn out from the second roller housing 32. The third display portion 73 may be positioned to be substantially parallel to the first display portion 71. The first dummy portion 74 may be in contact with the first roller 21. The second dummy portion 75 may be in contact with the second roller 31.

In the expanded mode, the first display portion 71, the second display portion 72 and the third display portion 73 may each display an image. Thus, the second display portion 72 and the third display portion 73 may be a display area. Therefore, a size of the display unit may be increased. In the unexpanded mode, the first display portion 71 may be substantially flat. In the expanded mode, the first display portion 71, the second display portion 72 and the third display portion 73 may each be substantially flat.

Referring to FIGS. 3 and 4, the first roller portion 20 may include a first guiding part 24. The first guiding part 24 may support the second display portion 72. The first guiding part 24 may also support a first dummy portion 74. The first guiding part 24 may guide a sliding of each of the second display portion 72 and the first dummy portion 74. The first guiding part 24 may be affixed to the first roller housing 22, for example, at the rear of the support plate 11. The first guiding part 24 affixed to the first roller housing 22 may form an inner space. The inner space may have an opening in a direction toward the first roller 21. The first guiding part 24 may be configured to receive each of the second display portion 72 and the first dummy portion 74 in the inner space.

The second roller portion 30 may include a second guiding part 34. The second guiding part 34 may support the third display portion 73. The second guiding part 34 may also support the second dummy portion 75. The second guiding part 34 may guide a sliding of each of the third display portion 73 and the second dummy portion 75. The second guiding part 34 may be affixed to the second roller housing 32, for example, at the rear of the support plate 11. The second guiding part 34 affixed to the second roller housing 32 may form an inner space. The inner space may have an opening in a direction toward the second roller 31. The second guiding part 34 may be configured to receive each of the third display portion 73 and the second dummy portion 75 in the inner space. The first guiding part 24 and the second guiding part 34 may overlap each other on the auxiliary support plate 12.

Referring to FIG. 4, the flexible display panel 70, the first roller housing 22 and the second roller housing 32, may each be folded; however exemplary embodiments of the present invention are not limited thereto. For example, the first roller housing 22 and the second roller housing 32 may together form a space. The space may be configured to receive the flexible display panel 70. Thus, movement of the flexible display panel 70 might not be constrained.

Referring to FIGS. 1 to 3 and FIG. 9, a numeral 80 may refer to a driving module unit. The driving module unit 80 may include a flexible circuit board 81 and a printed circuit board (PCB) 82. The flexible circuit board 81 may be a chip on film (COF). The printed circuit board (PCB) 82 may be connected to the flexible circuit board 81. The flexible circuit board 81 may be affixed to an outside of the first display portion 71. The flexible circuit board 81 may be folded by about 180°. Thus, the flexible circuit board 81 may be positioned at the rear of the first display portion 71. The printed circuit board (PCB) 82 may also be positioned at the rear of the first display portion 71.

If the driving module unit is connected to the first dummy portion 74 or the second dummy portion 75, the driving module unit may respectively slide with the first dummy portion 74 or the second dummy portion 75. Thus, the driving module unit may be damaged with relative ease.

The first display portion 71 may be a stationary part. Thus, the first display portion 71 may be a part that does not slide. Accordingly, damage to the driving module unit 80 connected to the first display portion 71 may be minimized or prevented. A module support plate 17 may support the driving module unit 80. The module support plate 17 may be positioned between the support plate 11 and the auxiliary support plate 12. Thus, as the expandable display device 100 connects the driving module unit 80 to the first display portion 71, damage to the driving module unit 80 may be minimized or prevented.

The expandable display device 100 may be a dual-expandable display device. Thus, the expandable display device 100 may extend in both directions. Accordingly, a size of the display unit in the expanded mode may be increased. In the expanded mode, the plurality of first moving rails 62 and the plurality of second moving rails 63 may each slide to support the second display portion 72 and the third display portion 73, respectively. Accordingly, sagging of the flexible display panel 70 may be minimized or prevented, stress applied to the flexible display panel 70 may be reduced, and a stable reduction-expansion operation may be provided.

Figure 10:
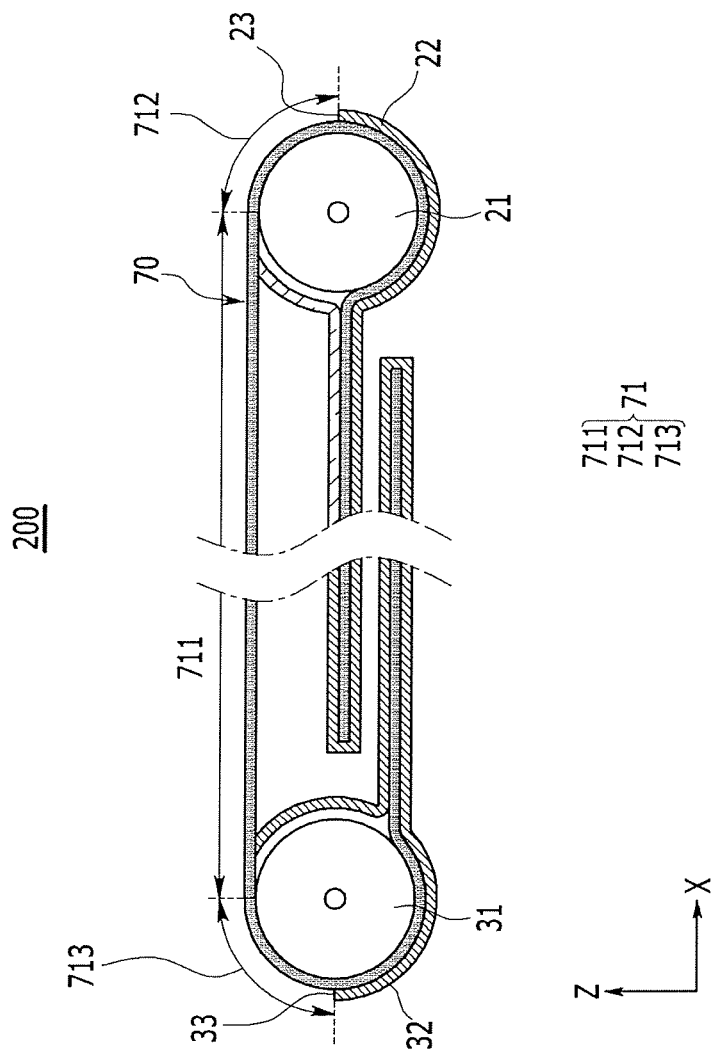
FIG. 10 is a cross-sectional view illustrating an unexpanded mode of an expandable display device according to an exemplary embodiment of the present invention.
Figure 11:
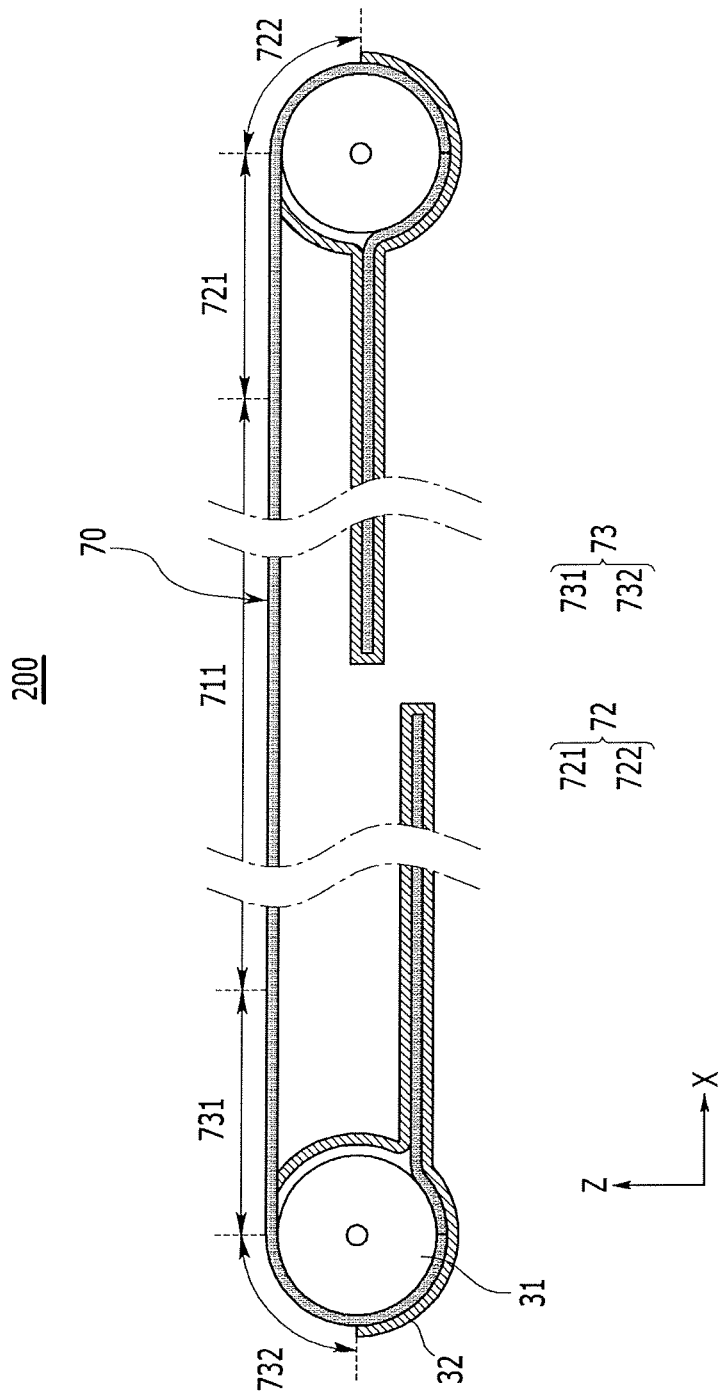
FIG. 11 is a cross-sectional view illustrating an expanded mode of an expandable display device according to an exemplary embodiment of the present invention.

FIG. 10 is a cross-sectional view illustrating an unexpanded mode of an expandable display device according to an exemplary embodiment of the present invention. FIG. 11 is a cross-sectional view illustrating an expanded mode of an expandable display device according to an exemplary embodiment of the present invention.

Referring to FIGS. 10 and 11, a flexible display panel 70 of an expandable display device 200 may further include a curved display portion.

For example, the first slit 23 may have a size for an opening of about a quarter of the first roller 21 along the circumferential direction of the first roller 21. The second slit 33 may have a size for opening of about one quarter of the second roller 31 along the circumferential direction of the second roller 31. The part of the flexible display panel 70 in contact with each of the first roller 21 and the second roller 31 may be opened to the outside. Thus, a curved display portion may be provided.

In the unexpanded mode, the first display portion 71 may include a first flat portion 711, a first curved portion 712, and a second curved portion 713. The first flat portion 711 may overlap each of a support plate. The first curved portion 712 may be in contact with the first roller 21. As a result, the first curved portion 712 may be curved. The second curved portion 713 may be in contact with the second roller 31. As a result, the second curved portion 713 may be curved.

In the expanded mode, the first display portion 71 may be substantially flat. The second display portion 72 may include a second flat portion 721 and a third curved portion 722. The second flat portion 721 may be supported by a plurality of first moving rails. The third curved portion 722 may be in contact with the first roller 21. As a result, the third curved portion 722 may be curved. The third display portion 73 may include a third flat portion 731 and a fourth curved portion 732. The third flat portion 731 may be supported by a plurality of second moving rails. The fourth curved portion 732 may be in contact with the second roller 31. As a result, the fourth curved portion 732 may be curved.

The expandable display device 200 may expand the display area using the first curved portion 712 and the second curved portion 713. Alternatively, the expandable display device 200 may expand the display area using the third curved portion 722 and the fourth curved portion 732. The expandable display device 200 may be substantially the same as or similar to the expandable display device 100 described herein; however, the expandable display device 200 may include the first to fourth curved portions 712, 713, 722, and 732.

Figure 12:
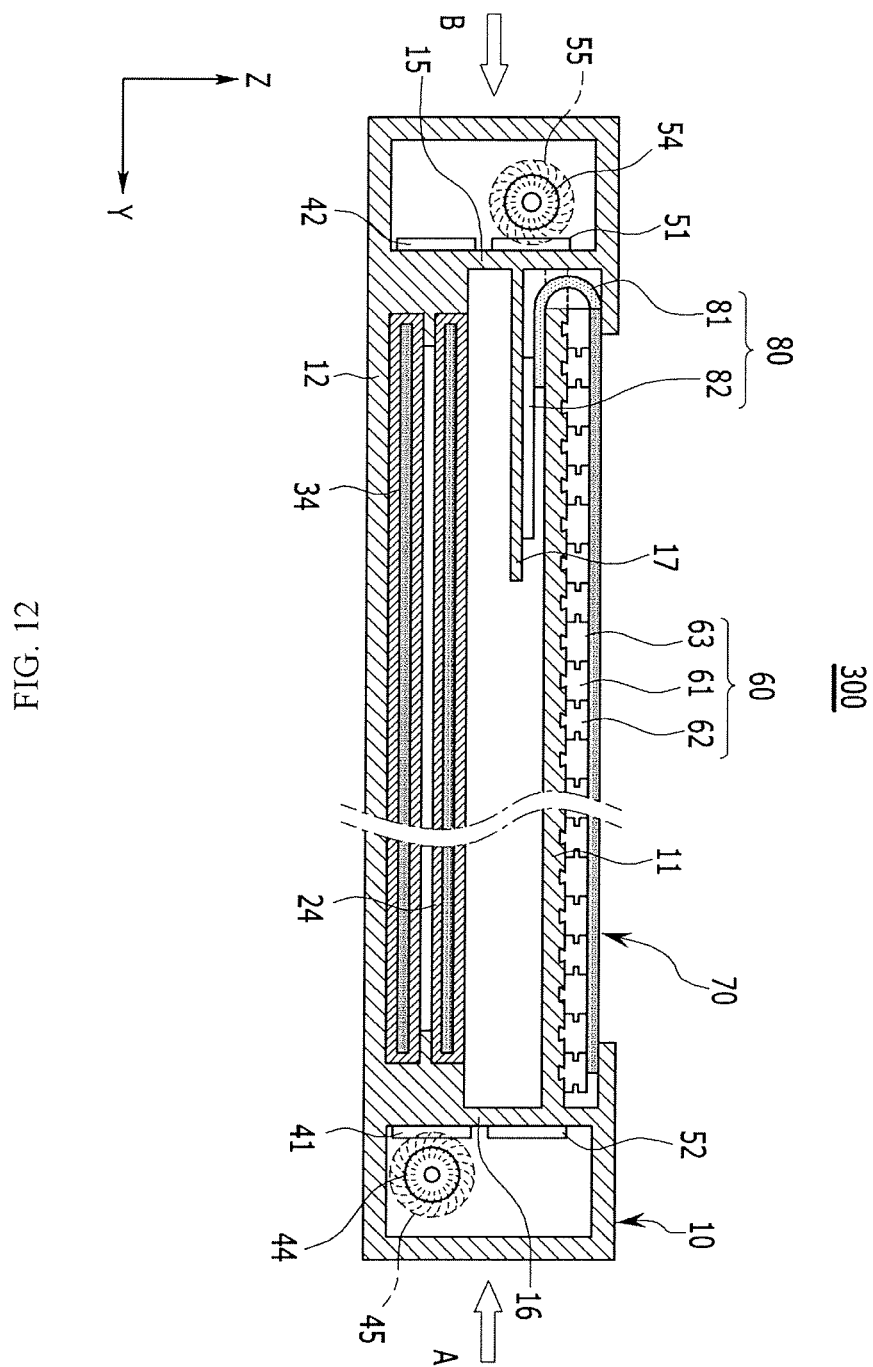
FIG. 12 is a cross-sectional view illustrating an expandable display device according to an exemplary embodiment of the present invention.
Figure 13A:
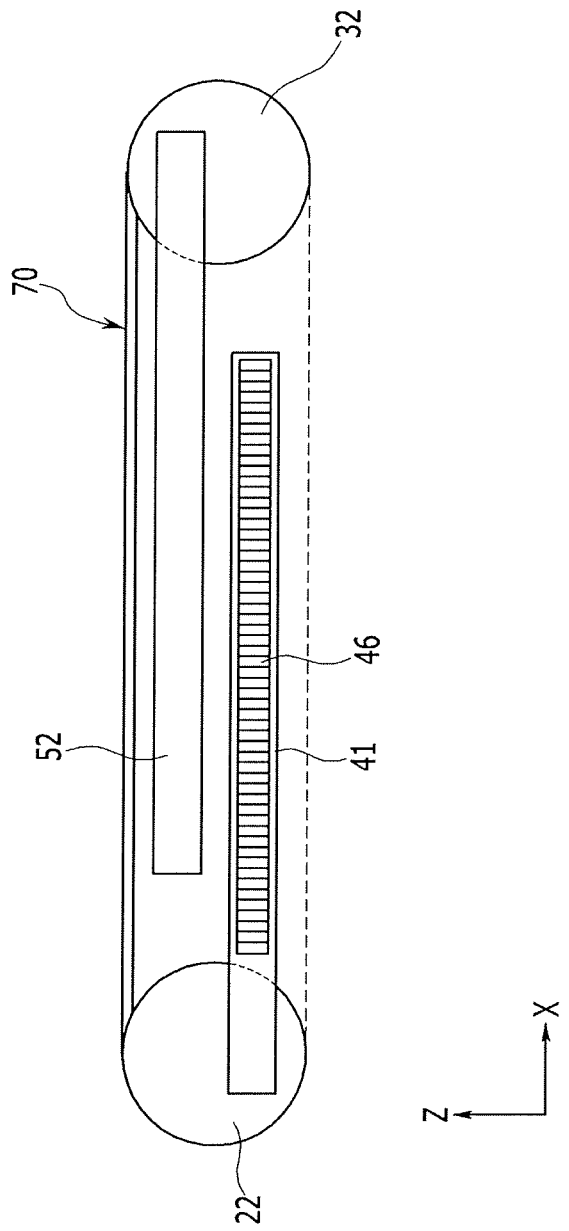
FIG. 13A is a partial schematic diagram illustrating an expandable display device viewing in a direction A of FIG. 12 according to an exemplary embodiment of the present invention.
Figure 13B:
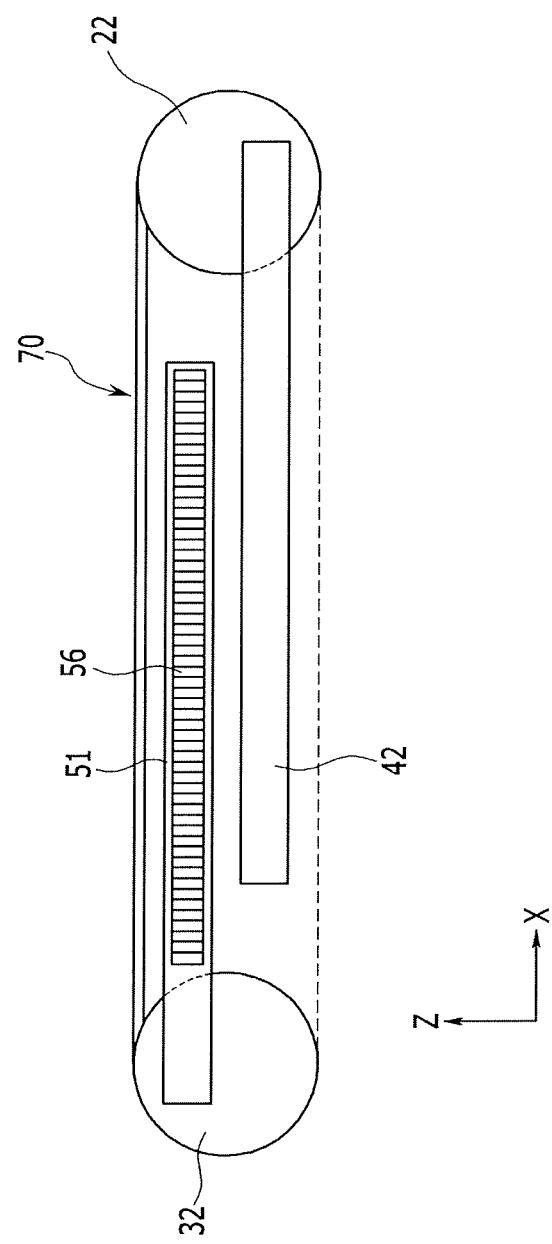
FIG. 13B is a partial schematic diagram illustrating an expandable display device viewing in a direction B of FIG. 12 according to an exemplary embodiment of the present invention.

FIG. 12 is a cross-sectional view illustrating an expandable display device according to an exemplary embodiment of the present invention. FIG. 13A is a partial schematic diagram illustrating an expandable display device viewing in a direction A of FIG. 12 according to an exemplary embodiment of the present invention. FIG. 13B is a partial schematic diagram illustrating an expandable display device viewing in a direction B of FIG. 12 according to an exemplary embodiment of the present invention.

Referring to FIGS. 12, 13A, and 13B, in an expandable display device 300, the first driving slider 41 and the second following slider 52 may face each other along the Z-axis direction. The second driving slider 51 and the first following slider 42 may face each other along the Z-axis direction.

The first driving slider 41 and the second following slider 52 might not interfere with each other due to a height difference between the first driving slider 41 and the second following slider 52. The second driving slider 51 and the first following slider 42 might not interfere with to each other due to a height difference between the second driving slider 51 and the first following slider 42.

Referring to FIGS. 12, 13A, and 13B, a pair of first sliders 41 and 42 may be positioned at lower sides of a pair of second sliders 51 and 52. Alternatively, the pair of second sliders 51 and 52 may be positioned at lower sides of the pair of first sliders 41 and 42.

The first motor 44 may be positioned at substantially the same height as the first driving slider 41. The second motor 54 may be positioned at substantially the same height as the second driving slider 51. The first guiding wall 15 of the housing 10 may guide a movement of each of the first driving slider 41 and the second following slider 52. The second guiding wall 16 may guide a movement of each of the second driving slider 51 and the first following slider 42.

The expandable display device 300 may be substantially the same as or similar to the expandable display devices 100 and 200 described herein; however, the positions of a pair of first sliders 41 and 42 and the pair of second sliders 51 and 52 of the expandable display device 300 may differ from the expandable display devices 100 and 200.

FIG. 14 is a partial cross-sectional view illustrating an expandable display device according to an exemplary embodiment of the present invention. FIG. 15 is a schematic diagram illustrating a second roller and a flexible display panel of FIG. 14 according to an exemplary embodiment of the present invention.

Referring to FIGS. 14 and 15, in an expandable display device 400, the flexible display panel 70 may include a metal sheet 76. The first roller 21 and the second roller 31 may respectively include a plurality of first magnets 25 and a plurality of second magnets 35. The plurality of first magnets 25 and the plurality of second magnets 35 may each increase a close contacting property of the flexible display panel 70.

The flexible display panel 70 may include a substrate, a plurality of pixels, and an encapsulation layer. The plurality of pixels may be disposed on the substrate. The encapsulation layer may cover the plurality of pixels. The metal sheet 76 may be positioned below the substrate, for example, in a direction toward the rail portion 60. The metal sheet 76 may be covered by a cushion sheet. The cushion sheet may protect the metal sheet 76.

The plurality of first magnets 25 may have a belt shape. The belt shape may be substantially parallel to the axis direction of the first roller 21. The plurality of first magnets 25 may be disposed at substantially equal intervals along the circumferential direction of the first roller 21. The plurality of second magnets 35 may have a belt shape. The belt shape may be substantially parallel to the axis direction of the second roller 31. The plurality of second magnets 35 may be disposed at substantially equal intervals along the circumferential direction of the second roller 31.

The plurality of first magnets 25 may pull the metal sheet 76 to close the flexible display panel 70 to the first roller 21. The plurality of second magnets 35 may pull the metal sheet 76 to close the flexible display panel 70 to the second roller 31.

The expandable display device 400 may increase the close contacting property of the flexible display panel 70, for example, by using the metal sheet 76, the plurality of first magnets 25, and the plurality of second magnets 35. The expandable display device 400 may be substantially the same as the expandable display devices 100, 200 and 300 described herein; however, the expandable display device may include the metal sheet 76, the plurality of first magnets 25, and the plurality of second magnets 35.

Figure 16:
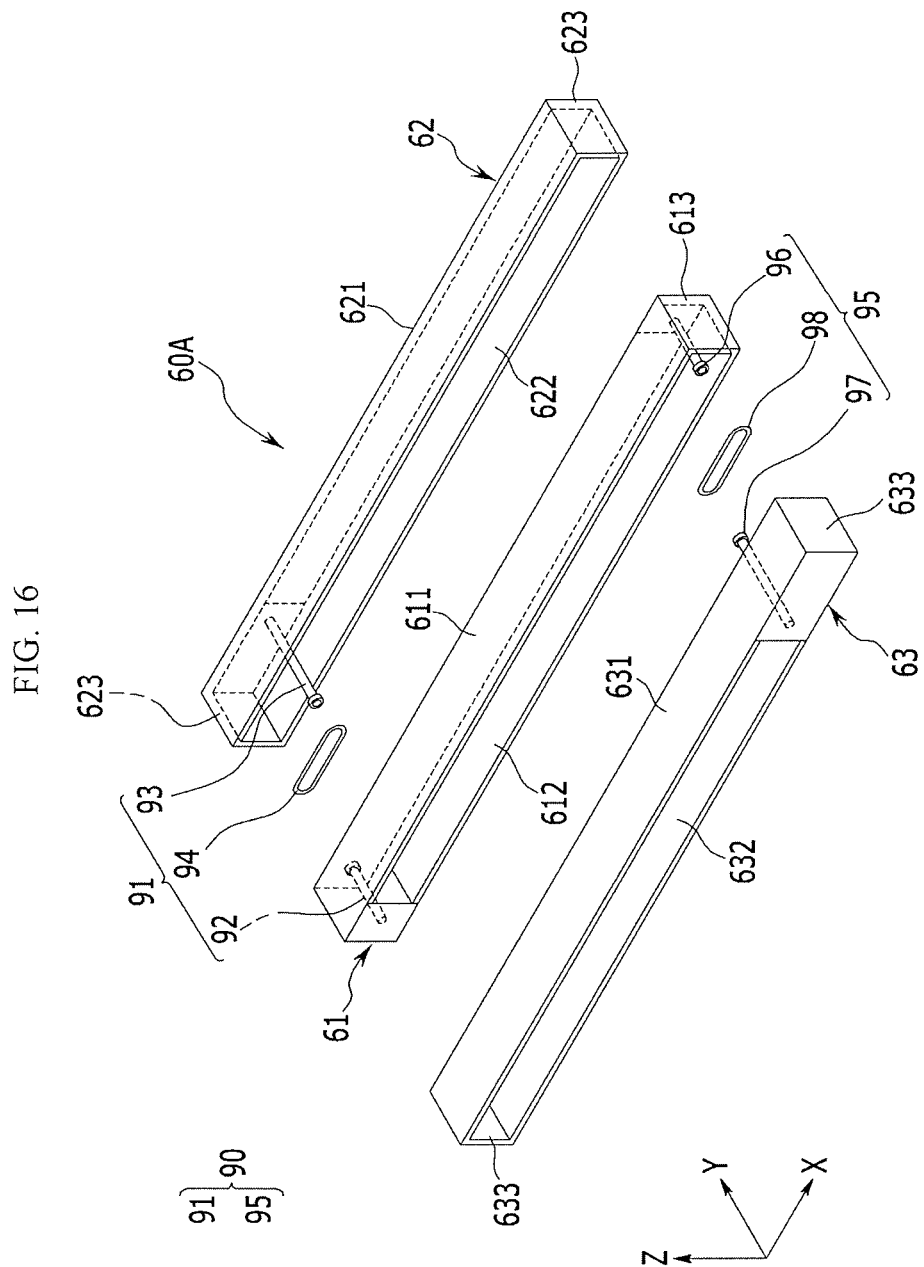
FIG. 16 is a partial exploded perspective view illustrating a rail portion of an expandable display device according to an exemplary embodiment of the present invention.
Figure 17:
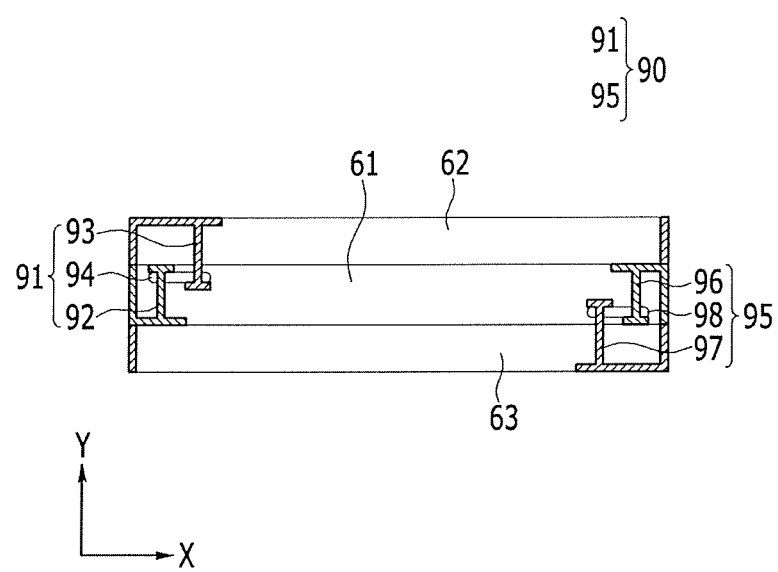
FIG. 17 is a cross-sectional view illustrating an unexpanded mode of a rail portion of FIG. 16 according to an exemplary embodiment of the present invention.
Figure 18:
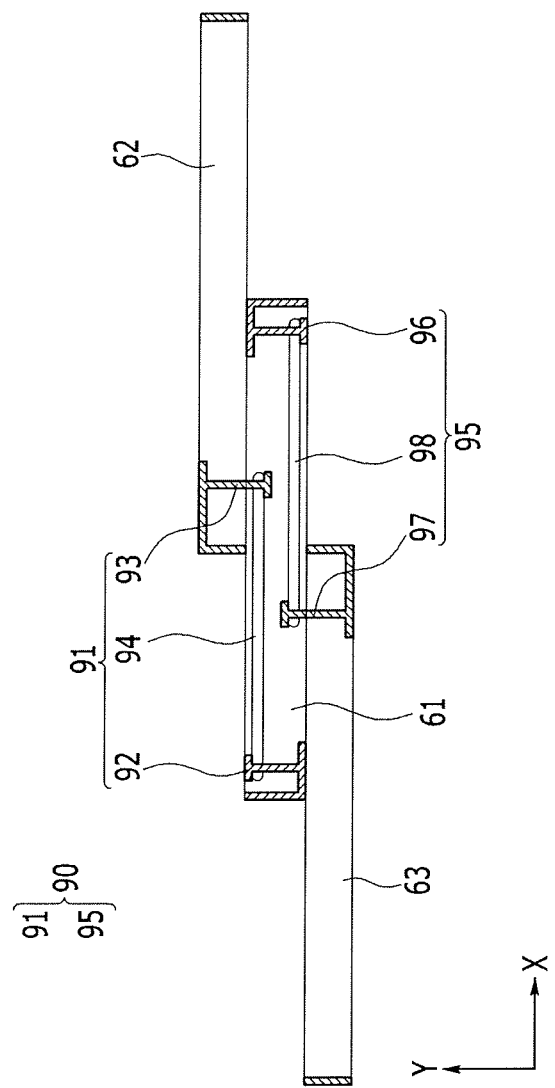
FIG. 18 is a cross-sectional view illustrating an expansion mode of a rail portion of FIG. 16 according to an exemplary embodiment of the present invention.

FIG. 16 is a partial exploded perspective view illustrating a rail portion of an expandable display device according to an exemplary embodiment of the present invention. FIG. 17 is a cross-sectional view illustrating an unexpanded mode of a rail portion of FIG. 16 according to an exemplary embodiment of the present invention. FIG. 18 is a cross-sectional view illustrating an expansion mode of a rail portion of FIG. 16 according to an exemplary embodiment of the present invention.

Referring to FIGS. 16 to 18, a single fixing rail 61, a single first moving rail 62, and a single second moving rail 63 are illustrated; however, exemplary embodiments of the present invention are not limited thereto. Referring to FIGS. 16 to 18, an expandable display device 500 may include a rail portion 60A. The rail portion 60A may include a tensioner 90.

In order to install the tensioner 90, each of the fixing rail 61, the first moving rail 62, and the second moving rail 63 may be include an annular rail. The annular rail may include upper parts 611, 621, and 631, lower parts 612, 622, and 632, and side walls 613, 623, and 633. In each of the fixing rail 61, the first moving rail 62, and the second moving rail 63, the upper parts 611, 621, and 631 and the lower parts 612, 622, and 632 may face each other along the Z-axis direction. Each of the side walls 613, 623, and 633 may face each other along the X-axis direction.

The tensioner 90 may include a first tensioner 91 and a second tensioner 95. The first tensioner 91 may be affixed to the fixing rail 61 and the first moving rail 62. The second tensioner 95 may be affixed to the fixing rail 61 and the second moving rail 63.

The first tensioner 91 may include a first fixing pin 92, a first moving pin 93, and a first elastic part 94. The first fixing pin 92 may be affixed to an inner first side of the fixing rail 61. The first moving pin 93 may be affixed to a first inner side of the first moving rail 62. The first moving pin 93 may extend to an inside of the fixing rail 61. The first elastic part 94 may be disposed between the first fixing pin 92 and the first moving pin 93.

In the unexpanded mode, the first moving pin 93 may be separated from the first fixing pin 92 along the X-axis direction. The first moving pin 93 may extend to the inside of the fixing rail 61. The first moving pin 93 may face the first fixing pin 92 along the X-axis direction inside the fixing rail 61. The first elastic part 94 may be an elastic member. The elastic member may have a ring shape. The elastic part 94 may wind each of the first fixing pin 92 and the first moving pin 93 about one turn inside the fixing rail 61.

The second tensioner 95 may include a second fixing pin 96, a second moving pin 97, and a second elastic part 98. The second fixing pin may be affixed to a second inner side of the fixing rail 61. The second moving pin 97 may be affixed to a second inner side of the second moving rail 63. The second moving pin 97 may extend to the inside of the fixing rail 61. The second elastic part 98 may be disposed between the second fixing pin 96 and the second moving pin 97.

In the unexpanded mode, the second moving pin 97 may be separated from the second fixing pin 96 along the X-axis direction. The second moving pin 97 may extend to the inside of the fixing rail 61. The second moving pin 97 may face the second fixing pin 96 along the X-axis direction inside the fixing rail 61. The second elastic part 98 may be the elastic member. The elastic member may have a ring shape. The second elastic part 98 may wind each of the second fixing pin 96 and the second moving pin 97 inside the fixing rail 61.

The first elastic part 94 and the second elastic part 98 may be separated from each other along the Y-axis direction inside the fixing rail 61. Thus, interference between the first elastic part 94 and the second elastic part 98 might not occur. In the expansion mode, if the first moving rail 62 and the second moving rail 63 slide, tension may be applied to each of the first moving rail 62 and the second moving rail 63 while the first elastic part 94 and the second elastic part 98 are deformed, respectively.

The expandable display device 500 may reduce or prevent shaking of the rail portion 60A by using the tensioner 90. The expandable display device may also support the flexible display panel. The expandable display device 500 may be substantially the same as the expandable display devices 100, 200, 300 and 400 described herein; however, the shape of the rail portion 60A and the tensioner 90 of the expandable display device 600 may differ.

FIG. 19A to FIG. 19F are enlarged cross-sectional views illustrating a rail portion of an expandable display device according to an exemplary embodiment exemplary embodiment of the present invention.

Referring to FIGS. 19A to 19F, in an expandable display device 600, one moving rail of the first moving rail 62 and the second moving rail 63 may be positioned below two fixing rails 61 adjacent along the Y-axis direction. The sequence of the fixing rail 61, the first moving rail 62, the fixing rail 61, the second moving rail 63, and the fixing rail 61 may be repeatedly disposed along the Y-axis direction; however, exemplary embodiments of the present invention are not limited thereto. The first moving rail 62 and the second moving rail 63 may have substantially the same shape.

Figure 19A:
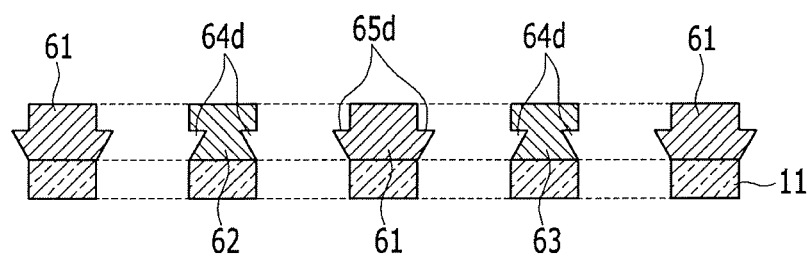
FIGS. 19A to 19F are enlarged cross-sectional views illustrating a rail portion of an expandable display device according to an exemplary embodiment of the present invention.
Figure 19B:
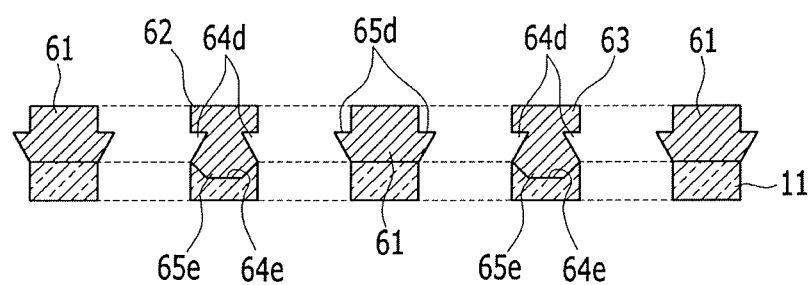
Figure 19C:
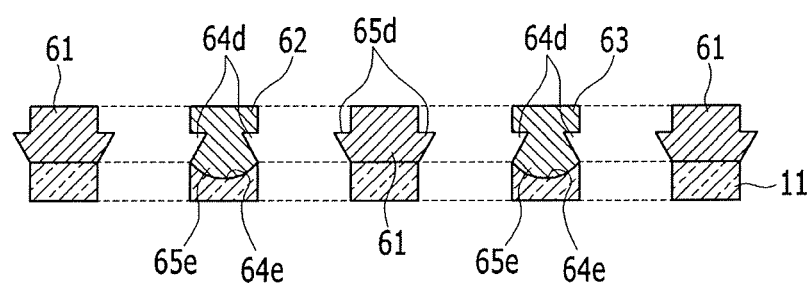

Referring to FIGS. 19A, 19B, and 19C, the fixing rail 61 may include a fourth protrusion 65*d*. The fourth protrusion 65*b* may have a wedge shape. The fourth protrusion 65*b* may be disposed at a lower portion of both side surfaces of the fixing rail 61. Each of the first moving rail 62 and the second moving rail 63 may include a fourth groove 64*d*. The fourth groove 64*d* may be disposed formed at the lower portion of both side surfaces of the fixing rail 61. The fourth groove 64*d* may be configured to receive the fourth protrusion 65*d*.

In FIGS. 19B and 19C, each of the first moving rail 62 and the second moving rail 63 may include a fifth protrusion 65*e*. The fifth protrusion 65*e* may be disposed at a lower portion of the lower surface of the fixing rail 61. The support plate 11 may include a plurality of fifth grooves 64*e*. The plurality of fifth grooves 64*e* may be disposed at the upper surface of the fixing rail 61 to respectively receive a plurality of fifth protrusions 65*e*. Referring to FIG. 19B, the fifth protrusion 65*e* may have an angled shape. Referring to FIG. 19C, the fifth protrusion 65*e* may have a rounded shape.

Figure 19D:
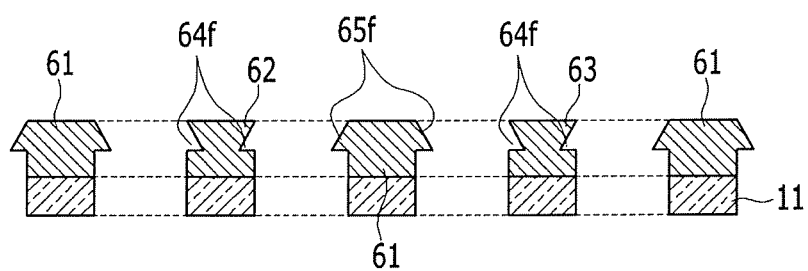
Figure 19E:
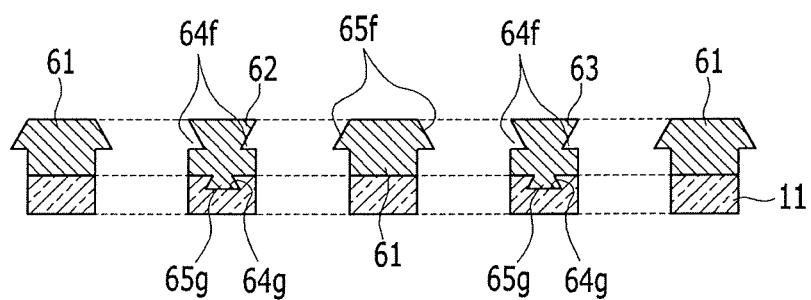

Referring to FIGS. 19D and 19E, the fixing rail 61 may include a sixth protrusion 65*f*. The sixth protrusion 65*f* may have a wedge shape. The sixth protrusion 65*f* may be disposed on the upper side of both side surfaces of the fixing rail 61. Each the first moving rail 62 and the second moving rail 63 may include a sixth groove 64*f*. The sixth groove 64*f* may be disposed at a lower side of both side surfaces of the first moving rail 62 and the second moving rail 63. The sixth groove 64*f* may be configured to receive the sixth protrusion 65*f*.

Referring to FIG. 19E, each of the first moving rail 62 and the second moving rail 63 may include a seventh protrusion 65*g*. The seventh protrusion 65*g* may be disposed at the lower surface of each of the first moving rail 62 and the second moving rail 63. The support plate 11 may include a plurality of seventh grooves 64*g*. The seventh grooves 64*g* may be disposed on the upper surface thereof. The seventh grooves 64g may be configured to respectively receive the plurality of seventh protrusions 65g.

Figure 19F:
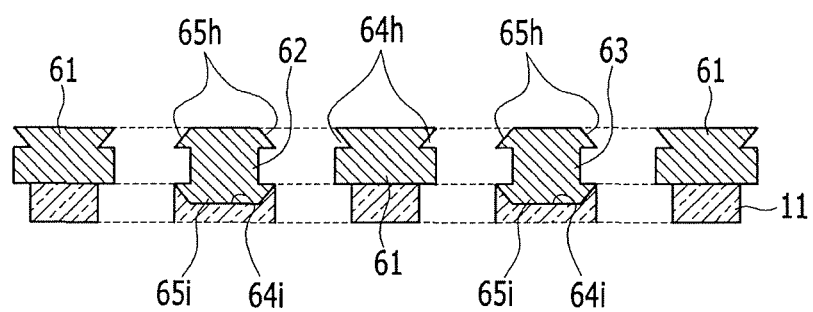

Referring to FIG. 19F, each of the first moving rail 62 and the second moving rail 63 may include an eighth protrusion 65h. The eighth protrusion 65h may have a wedge shape. The eighth protrusion 65h may be disposed on the upper portion of both side surfaces thereof. The fixing rail 61 may include an eighth groove 64h formed at the upper side of both side surfaces to receive the eighth protrusion 65h. Also, each of the first moving rail 62 and the second moving rail 63 may include a ninth protrusion 65i formed at the lower surface, and the support plate 11 may include a plurality of ninth grooves 64i formed at the upper surface to respectively receive a plurality of ninth protrusions 65i.

Figure 20:
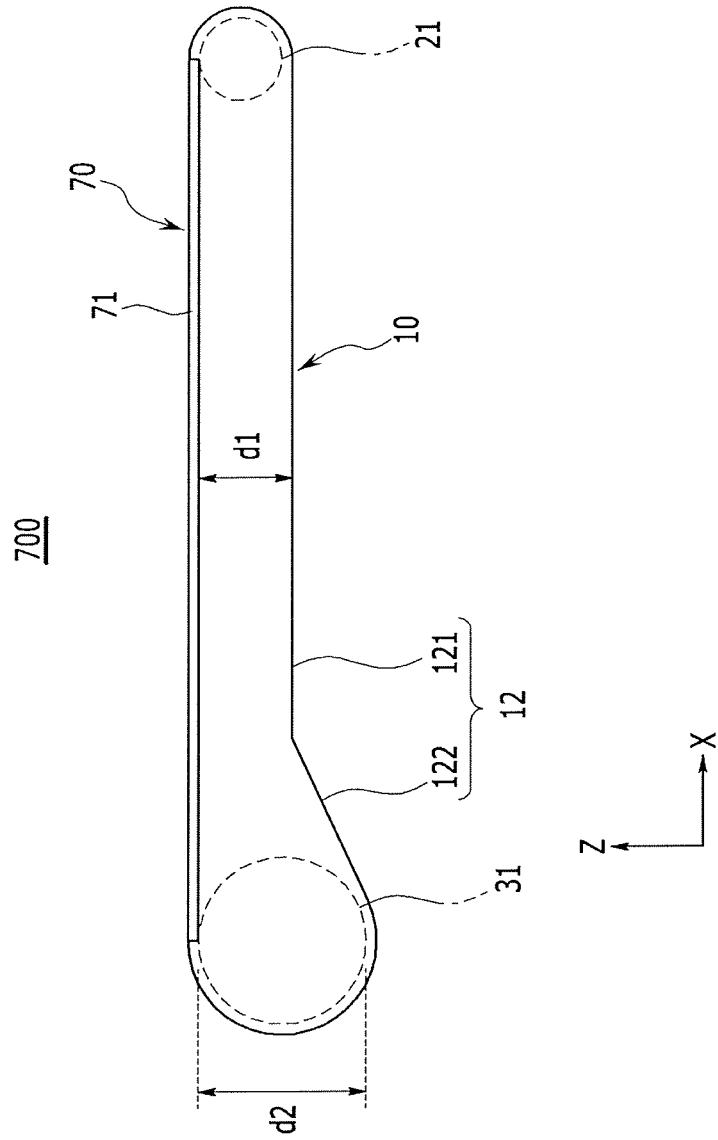
FIG. 20 is a side view illustrating an expandable display device according to an exemplary embodiment of the present invention.

FIG. 20 is a side view illustrating an expandable display device according to an exemplary embodiment of the present invention.

Referring to FIG. 20, in an expandable display device 700, the first roller 21 and the second roller 31 may have different diameters from each other. The auxiliary support plate 12 of the housing 10 may include a flat portion 121 and one inclination portion 122.

Referring to FIG. 20, the diameter of the second roller 31 may be larger than the diameter of the first roller 21. A distance d1 between the first display portion 71 and the flat portion 121 may be smaller than a diameter d2 of the second roller 31. The inclination portion 122 may be positioned toward the second roller 31.

The expandable display device 700 may be substantially the same as or similar to display devices 100, 200, 300, 400, 500 and 600 described herein; however, the size of the first roller 21 and the second roller 31 and the shape of the auxiliary support plate 12 may differ.

FIG. 21 is a side view illustrating an expandable display device according to an exemplary embodiment of the present invention.

Referring to FIG. 21, in an expandable display device 800, the first roller 21 and the second roller 31 may have substantially the same diameter. The auxiliary support plate 12 of the housing 10 may include one flat portion 121 and two inclination portions 122. The two inclination portions 122 may be positioned along the X-axis direction. The flat portion 121 may be disposed between the inclination portions 122.

The distance d3 between the first display portion 71 and the flat portion 121 may be smaller than the diameter d4 of the first roller 21 and the second roller 31. Two inclination portions 122 may be positioned toward the first roller 21 and the second roller 31. The expandable display device 800 may have a dumbbell shape.

The expandable display device 800 may be substantially the same as or similar to the expandable display devices 100, 200, 300, 400, 500, 600 described herein; however the shape of the auxiliary support plate 12 may differ.

While exemplary embodiments of the present invention have been described herein, it is to be understood that the present invention is not limited thereto, but, on the contrary, is intended to cover various modifications and equivalent arrangements included within the spirit and scope of the present invention.

What is claimed is:

1. A display device, comprising:
a housing including a support plate;
a first roller portion disposed at a first side of the support plate and connected to the housing by a first sliding portion;
a second roller portion disposed at a second side of the support plate and connected to the housing by a second sliding portion;
a rail portion including a plurality of fixing rails, a plurality of first moving rails, and a plurality of second moving rails; and
a flexible display panel covering the rail portion, the flexible display panel having ends respectively connected to each of the first roller portion and the second roller portion,
wherein the plurality of fixing rails are affixed to the support plate, the plurality of first moving rails are connected to the first roller portion and engaged with the plurality of fixing rails, and the plurality of second moving rails are connected to the second roller portion and engaged with the plurality of fixing rails,
wherein the plurality of first moving rails and the plurality of second moving rails are disposed between the support plate and the flexible display panel and
wherein the plurality of first moving rails are configured to move in a first direction, and the plurality of second moving rails are configured to move in a second direction opposite and parallel to the first direction,
wherein at least one first moving rail and at least one second moving rail are alternately disposed between the plurality of fixing rails.

2. The display device of claim 1, wherein:
the first roller portion includes a first roller and a first roller housing, the first roller housing partially enclosing the first roller and including a first slit substantially parallel to an axis direction of the first roller; and
the second roller portion includes a second roller and a second roller housing, the second roller housing partially enclosing the second roller and including a second slit substantially parallel to the axis direction of the second roller.

3. The display device of claim 2, wherein:
the first sliding portion includes a first driving slider affixed to a first end of the first roller housing, a first following slider affixed to a second end of the first roller housing, and a first actuator connected to the first driving slider; and
the second sliding portion includes a second following slider affixed to a first end of the second roller housing, a second driving slider affixed to a second end of the second roller housing, and a second actuator connected to the second driving slider.

4. The display device of claim 3, wherein:
the first driving slider and the second following slider are separated from each other along the axis direction of the first roller and a first guiding wall is disposed between the first driving slider and the second following slider; and
the second driving slider and the first following slider are separated from each other along the axis direction of the first roller and a second guiding wall is disposed between the second driving slider and the first following slider.

5. The display device of claim 3, wherein:
the first driving slider and the second following slider face each other along a thickness direction of the display device and are each configured to move along a first guiding wall; and
the second driving slider and the first following slider face each other along the thickness direction and are each configured to move along a second guiding wall.

6. The display device of claim 2, wherein:
the plurality of first moving rails are affixed to the first roller housing;
the plurality of second moving rails are affixed to the second roller housing; and
the plurality of first moving rails and the plurality of second moving rails each overlap the support plate in an unexpanded mode and outwardly extend from the support plate in an expanded mode.

7. The display device of claim 6, wherein
at least one first moving rail and at least one second moving rail having side surfaces engaged with each other are disposed between adjacent fixing rails.

8. The display device of claim 7, wherein
side surfaces of each of the plurality of fixing rails, the plurality of first moving rails, and the plurality of second moving rails are engaged with each other by a first protrusion-groove structure.

9. The display device of claim 8, wherein
at least one selected from the plurality of fixing rails, the plurality of first moving rails, and the plurality of second moving rails are engaged with the support plate to each other by a second protrusion-groove structure.

10. The display device of claim 6, wherein:
a length of each of the plurality of first moving rails is larger than a maximum sliding distance of the first roller housing; and
a length of each of the plurality of second moving rails is larger than a maximum sliding distance of the second roller housing.

11. The display device of claim 6, wherein:
the rail portion further includes a first tensioner affixed to at least one fixing rail and at least one first moving rail and a second tensioner affixed to at least one fixing rail and at least one second moving rail; and
each of the plurality of fixing rails, the plurality of first moving rails, and the plurality of second moving rails are an annular rail.

12. The display device of claim 11, wherein:
the first tensioner includes a first fixing pin affixed to the fixing rail, a first moving pin affixed to the first moving rail and extending inside the fixing rail, and a first elastic part disposed between the first fixing pin and the first moving pin; and
the second tensioner includes a second fixing pin affixed to the fixing rail, a second moving pin affixed to the second moving rail and extending inside the fixing rail, and a second elastic part disposed between the second fixing pin and the second moving pin.

13. The display device of claim 2, wherein
the flexible display panel includes:
a first display portion overlapping the support plate and affixed to the plurality of fixing rails;
a second display portion positioned at a first side of the first display portion; and
a third display portion positioned at a second side of the first display portion.

14. The display device of claim 13, wherein,
in an unexpanded mode,
the second display portion is disposed in the first roller housing through the first slit such that a part thereof is in contact with the first roller and a remaining part thereof overlaps the first display portion, and
the third display portion is disposed in the second roller housing through the second slit such that a part thereof is in contact with the second roller and a remaining part thereof overlaps the first display portion.

15. The display device of claim 14, wherein,
in an expanded mode,
the second display portion is removed from the first roller housing to be substantially parallel to the first display portion and is supported by the plurality of first moving rails, and
the third display portion is removed from the second roller housing to be substantially parallel to the first display portion and is supported by the plurality of second moving rails.

16. The display device of claim 15, wherein
the flexible display panel further includes a first dummy portion disposed outside the second display portion and a second dummy portion disposed outside the third display portion, and
in the expanded mode, the first dummy portion is in contact with the first roller and the second dummy portion is in contact with the second roller.

17. The display device of claim 16, wherein:
a first guiding part is connected to the first roller housing at a rear of the support plate and is configured to receive the second display portion and the first dummy portion; and
a second guiding part is connected to the second roller housing at the rear of the support plate and is configured to receive the third display portion and the second dummy portion.

18. The display device of claim 13, wherein
in an unexpanded mode, the first display portion includes a first flat portion, a first curved portion in contact with the first roller, and a second curved portion in contact with the second roller.

19. The display device of claim 18, wherein,
in an expanded mode,
the second display portion includes a second flat portion supported by the plurality of first moving rails and a third curved portion in contact with the first roller, and
the third display portion includes a third flat portion supported by the plurality of second moving rails and a fourth curved portion in contact with the second roller.

20. The display device of claim 13, wherein:
the flexible display panel includes a metal sheet disposed in a direction toward the rail portion;
the first roller includes a plurality of first magnets; and
the second roller includes a plurality of second magnets.

21. The display device of claim 20, wherein:
the plurality of first magnets form a belt shape substantially parallel to an axis direction of the first roller and are disposed at intervals along a circumferential direction of the first roller; and
the plurality of second magnets form a belt shape substantially parallel to an axis direction of the second roller and are disposed at intervals along the circumferential direction of the second roller.

* * * * *